United States Patent
Sato et al.

(10) Patent No.: US 10,904,468 B2
(45) Date of Patent: Jan. 26, 2021

(54) SIGNAL PROCESSING APPARATUS AND METHOD, IMAGING ELEMENT, AND ELECTRONIC APPARATUS

(71) Applicant: SONY CORPORATION, Tokyo (JP)

(72) Inventors: Mamoru Sato, Kanagawa (JP); Yusuke Oike, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 15 days.

(21) Appl. No.: 16/086,547

(22) PCT Filed: Mar. 14, 2017

(86) PCT No.: PCT/JP2017/010108
§ 371 (c)(1),
(2) Date: Sep. 19, 2018

(87) PCT Pub. No.: WO2017/169724
PCT Pub. Date: Oct. 5, 2017

(65) Prior Publication Data
US 2019/0104273 A1 Apr. 4, 2019

(30) Foreign Application Priority Data
Mar. 28, 2016 (JP) .................................. 2016-064076

(51) Int. Cl.
*H04N 5/3745* (2011.01)
*H03M 1/68* (2006.01)
(Continued)

(52) U.S. Cl.
CPC .......... *H04N 5/37455* (2013.01); *H03M 1/68* (2013.01); *H04N 5/341* (2013.01); *H04N 5/378* (2013.01)

(58) Field of Classification Search
CPC .... H04N 5/37455; H04N 5/341; H04N 5/378; H03M 1/68; H03M 1/183; H03M 1/56; H03M 1/123
(Continued)

(56) References Cited

U.S. PATENT DOCUMENTS 3,646,587 A  2/1972 Shaffstall et al.
6,559,788 B1  5/2003 Murphy
(Continued)

FOREIGN PATENT DOCUMENTS

CN  103809653 A  5/2014
CN  106576149 A  4/2017
(Continued)

OTHER PUBLICATIONS

International Search Report and Written Opinion of PCT Application No. PCT/JP2017/010108, dated Jun. 13, 2017, 10 pages of ISRWO.

*Primary Examiner* — Lin Ye
*Assistant Examiner* — Chan T Nguyen
(74) *Attorney, Agent, or Firm* — Chip Law Group

(57) ABSTRACT

The present disclosure relates to a signal processing apparatus and method, an imaging element, and an electronic apparatus capable of suppressing an increase in area. The present disclosure divides a predetermined current generated by receiving a gain control signal that controls a gain into a plurality of output currents and a non-output current in accordance with a value of an input digital signal and outputs the plurality of output currents as a plurality of analog signals. The present technology can be applied to for example, electronic circuits such as a D/A converter circuit and an A/D converter circuit, imaging elements such as a CMOS image sensor, electronic apparatuses such as a digital still camera, and the like.

21 Claims, 25 Drawing Sheets

(51) Int. Cl.
*H04N 5/378* (2011.01)
*H04N 5/341* (2011.01)

(58) Field of Classification Search
USPC .......................................................... 348/308
See application file for complete search history.

(56) References Cited

U.S. PATENT DOCUMENTS

2014/0132814 A1\* 5/2014 Ishii .................... H03M 1/0604
348/308
2017/0230599 A1\* 8/2017 Abiru .................... H04N 5/378

FOREIGN PATENT DOCUMENTS

| | | |
|---|---|---|
| DE | 2059933 A1 | 6/1971 |
| FR | 2070883 A1 | 9/1971 |
| GB | 1290429 A | 9/1972 |
| JP | 49-017900 A | 2/1974 |
| JP | 49-17900 B1 | 5/1974 |
| JP | 4682750 B2 | 5/2011 |
| JP | 2014-96758 A | 5/2014 |
| JP | 2014-096758 A | 5/2014 |
| WO | 2016/027683 A1 | 2/2016 |

\* cited by examiner

SIGNAL PROCESSING APPARATUS AND METHOD, IMAGING ELEMENT, AND ELECTRONIC APPARATUS

CROSS REFERENCE TO RELATED APPLICATIONS

This application is a U.S. National Phase of International Patent Application No. PCT/JP2017/010108 filed on Mar. 14, 2017, which claims priority benefit of Japanese Patent Application No. JP 2016-064076 filed in the Japan Patent Office on Mar. 28, 2016. Each of the above-referenced applications is hereby incorporated herein by reference in its entirety.

TECHNICAL FIELD

The present disclosure relates to a signal processing apparatus and method, an imaging element, and an electronic apparatus, and particularly relates to a signal processing apparatus and method, an imaging element, and an electronic apparatus capable of suppressing an increase in area.

BACKGROUND ART

As a D/A converter capable of controlling the gradient of the reference signal for single-slope integration A/D conversion with high accuracy, there is proposed a D/A converter circuit that sequentially selects current source cells current-controlled by a gain control D/A converter circuit and changes the current flowing to a reference resistor (for example, refer to Patent Document 1). This D/A converter circuit employs a mechanism in which the current of a non-selected current source cell is allowed to flow to a reference voltage so as to achieve a fixed total current.

CITATION LIST

Patent Document

Patent Document 1: Japanese Patent No. 4682750

SUMMARY OF THE INVENTION

Problems to be Solved by the Invention

This method, however, needs a D/A converter for individual channels in order to generate reference signals when reference signals for a plurality of channels are needed simultaneously such as a case of an adaptive gain multi-slope A/D converter and a multi-slope A/D converter, for example. Accordingly, this might result in an increase in the circuit area together with an increase in the number of channels of the reference signals.

The present disclosure is made in view of such a situation, and aims to be able to suppress an increase in area.

Solutions to Problems

A signal processing apparatus according to one aspect of present technology is a signal processing apparatus including a first D/A converter that is a D/A converter to convert a digital signal into an analog signal and that is configured to divide a predetermined current generated by receiving a gain control signal that controls a gain into a plurality of output currents and a non-output current in accordance with a value of an input digital signal and configured to output the plurality of output currents as a plurality of analog signals.

The first D/A converter can divide the current into a first output current and a first non-output current in accordance with the value of the digital signal, divide the first non-output current into a second output current and a second non-output current in accordance with the value of the digital signal, and can output the first output current and the second output current, individually.

The value of the digital signal may be varied in a time direction so as to increase the first output current and reduce the second output current.

The value of the digital signal may be varied in the time direction so as to increase the first output current and the second output current.

The apparatus may further include a current source that receives the gain control signal and generates the current.

The first D/A converter may include a switch that drives the digital signal as a control signal and that controls connection between each of signal lines connected to each of a plurality of output terminals that output the analog signals, signal lines connected to a voltage source, with the current source.

The first D/A converter may include a plurality of the switches configured in parallel, and may divide the current into the plurality of output currents and the non-output current in accordance with a ratio of the number of the switches connecting each of the signal lines with the current source.

The signal processing apparatus may further include a resistor that converts the output current into a voltage for each of the plurality of output currents.

Resistance values of the resistors corresponding to individual output currents can be made different from each other.

The apparatus may further include a second D/A converter that is a converter to convert a digital signal into an analog signal and that is configured to divide a predetermined current generated by receiving a gain control signal that controls a gain into a single output current and a non-output current in accordance with a value of the input digital signal and configured to use the output current to control the signal level of the analog signal output from the first D/A converter.

The apparatus may further include a gain control unit that generates the gain control signal and supplies the generated gain control signal to the first D/A converter so as to control the gain.

The apparatus may further include a digital signal generation unit that generates the digital signal and supplies the generated digital signal to the first D/A converter.

The apparatus may further include an A/D converter that converts an analog signal into a digital signal using the plurality of analog signals output from the first D/A converter as reference signals.

The A/D converter may be configured to be able to adaptively switch the gain by using the plurality of analog signals as reference signals.

The plurality of analog signals may be used by the mutually different A/D converters.

The A/D converter may be provided for each of columns of a pixel array including a plurality of unit pixels arranged in a matrix, and may convert a pixel signal read from each of pixels of the column corresponding to the own converter from an analog signal into a digital signal.

The A/D converter may be provided for each of areas of a pixel array including a plurality of unit pixels arranged in a matrix, and may convert a pixel signal read from each of pixels of the area corresponding to the own converter from an analog signal into a digital signal.

A signal processing method according to one aspect of present technology is a signal processing method including: dividing a predetermined current generated by receiving a gain control signal that controls a gain into a plurality of output currents and non-output currents in accordance with a value of an input digital signal; and outputting the plurality of output currents as a plurality of analog signals.

An imaging element according to another aspect of the present technology is an imaging element including: a pixel array including a plurality of unit pixels arranged in a matrix; a D/A converter that converts a digital signal into an analog signal and that divides a predetermined current generated by receiving a gain control signal that controls a gain into a plurality of output currents and a non-output current in accordance with a value of an input digital signal and then outputs the plurality of output currents as a plurality of analog signals; and an A/D converter that uses the plurality of analog signals output from the D/A converter as reference signals to convert the pixel signal being an analog signal read from the pixel array into a digital signal.

An electronic apparatus according to still another aspect of the present technology is an electronic apparatus including: an imaging unit that images a subject; and an image processing unit that performs image processing on image data obtained by imaging by the imaging unit, in which the imaging unit includes: a pixel array including a plurality of unit pixels arranged in a matrix; a D/A converter that converts a digital signal into an analog signal and that divides a predetermined current generated by receiving a gain control signal that controls a gain into a plurality of output currents and a non-output current in accordance with a value of an input digital signal and then outputs the plurality of output currents as a plurality of analog signals; and an A/D converter that uses the plurality of analog signals output from the D/A converter as reference signals to convert the pixel signal being an analog signal read from the pixel array into a digital signal.

In the signal processing apparatus and method according to one aspect of present technology, a predetermined current generated by receiving a gain control signal that controls a gain is divided into a plurality of output currents and non-output currents in accordance with a value of an input digital signal; and the plurality of output currents is output as a plurality of analog signals.

In the imaging element according to another aspect of the present technology, the predetermined current generated by receiving the gain control signal that controls the gain is divided into a plurality of output currents and non-output currents in accordance with the value of the digital signal, the plurality of output signals is output as analog signals, the plurality of analog signals is used as reference signals, and the pixel signal of the analog signal read from the pixel array including a plurality of unit pixels arranged in a matrix is converted into a digital signal.

In the electronic apparatus according to still another aspect of the present technology, the predetermined current generated by receiving the gain control signal that controls the gain is divided into a plurality of output currents and a non-output current in accordance with the value of the digital signal, the plurality of output signals is output as analog signals, the plurality of analog signals is used as reference signals, and the pixel signal of the analog signal read from the pixel array including a plurality of unit pixels arranged in a matrix is converted into a digital signal, and then, image data formed with the digital signals undergoes image processing.

Effects of the Invention

According to the present disclosure, it is possible to process signals. In particular, it is possible to suppress an increase in area.

MODE FOR CARRYING OUT THE INVENTION

Figure 1:
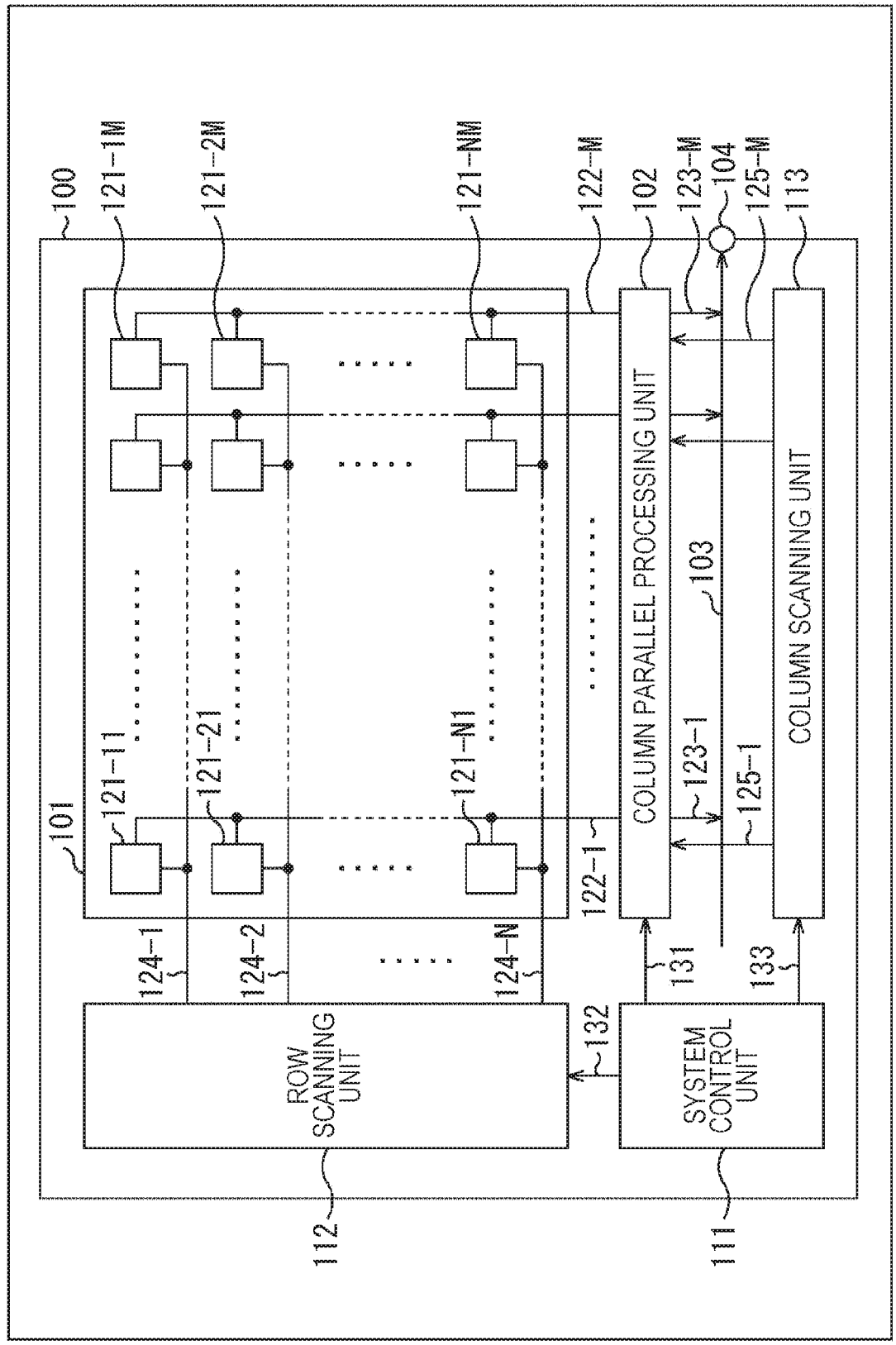
FIG. 1 is a diagram illustrating a main configuration example of an imaging element.

Hereinafter, embodiments for implementing the present disclosure (hereinafter referred to as embodiments) will be described. Note that the description is given in the following order.

1. First embodiment (imaging element)
2. Second embodiment (column parallel processing unit)
3. Third embodiment (reference signal generation unit)
4. Others

1. First Embodiment

<Generating a Plurality of Reference Signals>

Conventionally, execution of analog-to-digital (A/D) conversion in complementary metal oxide semiconductor (CMOS) image sensor widely uses a slope type A/D converter that compares a slope signal as a reference voltage with an image signal by a comparator, and counts the time until the output of the comparator is inverted. Moreover, a column A/D converter that arranges a plurality of A/D converters for each of pixel columns and simultaneously performs A/D conversion can reduce the operating frequency for one A/D converter to achieve both low noise and high speed, and shares the reference voltage by each of the A/D converters, leading to excellent area/power consumption efficiency and good compatibility with CMOS image sensors when compared with other A/D conversion methods.

As a digital-to-analog (D/A) converter capable of controlling the gradient of the reference signal for single-slope integration A/D conversion with high accuracy, there is proposed a D/A converter circuit that sequentially selects current source cells current-controlled by a gain control D/A converter circuit and changes the current flowing to a reference resistor (refer to Patent Document 1). This conventional technique employs a mechanism in which the current of a non-selected current source cell is allowed to flow to a reference voltage so as to achieve a fixed total current. Achieving the fixed total current can set the power supply voltage drop to be constant regardless of the voltage level, effective in improving the linearity of the reference signal and reducing the settling time, for example.

However, in a case where there is a need to generate a plurality of reference signals at the same time, in such a case of an adaptive gain multi-slope A/D converter, a multi-slope A/D converter, or the like, a plurality of D/A converter is necessary. Accordingly, this might result in an increase in the circuit area together with an increase in the number of channels of the reference signals. As the circuit area increases, for example, there is a need to enlarge the semiconductor substrate or reduce the pixel array (imaging region) by that amount. Therefore, this might increase the cost or degrade the image quality. Furthermore, this might result in an increase in power consumption together with an increase in the number of channels of the reference signals. Therefore, this might least to cost increase, reduction in the operable period of battery driving or reduction in the service life.

For example, the D/A converter circuit occupies 0.85 W of the total power of 3.0 W of the imaging element in some cases, and a configuration requiring twice the number of channels might greatly increase the area and electric power.

<Generating a Plurality of Reference Signals>

Therefore, a D/A converter that converts a digital signal into an analog signal is configured to divide a predetermined current generated by receiving a gain control signal that controls a gain into a plurality of output currents and a non-output current in accordance with a value of an input digital signal and configured to output the plurality of output currents as a plurality of analog signals.

This configuration makes it possible to output a plurality of analog signals by one D/A converter, enabling suppression of an increase in area and power consumption.

<Imaging Element>

FIG. 1 illustrates a main configuration example of an image sensor as an embodiment of an imaging element according to the present technology. An image sensor 100 illustrated in FIG. 1 is a device that photoelectrically converts light from a subject and outputs it as image data. Examples of the image sensor 100 include a CMOS image sensor using a complementary metal oxide semiconductor (CMOS), a CCD image sensor using a charge coupled device (CCD), and the like.

As illustrated in FIG. 1, the image sensor 100 includes a pixel array 101, a column parallel processing unit 102, a bus 103, an output terminal 104, a system control unit 111, a row scanning unit 112, and a column scanning unit 113.

The pixel array 101 is a pixel region in which a pixel configuration (unit pixel) having a photoelectric conversion element such as a photodiode is arranged in a planar shape or a curved shape. In the example of FIG. 1, N×M unit pixels 121 (unit pixels 121-11 to 121-NM) are arranged in a matrix (in the form of array) of N rows and M columns. Hereinafter, in a case where it is not necessary to distinguish the unit pixel 121-11 to the unit pixel 121-NM from each other in the description, they each will be referred to as the unit pixel(s) 121. The arrangement of the unit pixels 121 may take any form, and the arrangement may be other than a matrix, such as a honeycomb structure, for example.

Each of the unit pixels 121 of the pixel array 101 is connected to vertical signal line 122-1 to vertical signal line 122-M for each of unit pixel columns (columns). Hereinafter, in a case where it is not necessary to distinguish the vertical signal lines 122-1 to 122-M from each other, they each will be referred to as the vertical signal line(s) 122. An analog signal read from each of the unit pixels 121 is transmitted to a column parallel processing unit 102 via the vertical signal line 122 (any of the vertical signal line 122-1 to the vertical signal line 122-M) corresponding to the unit pixel column (column).

The column parallel processing unit 102 processes a signal transmitted from each of the unit pixels 121 of the pixel array 101 via the vertical signal line 122 independently for each of the columns. For example, the column parallel processing unit 102 performs A/D conversion individually on analog signals (for example, pixel signals) of each of columns read from the pixel array 101.

Furthermore, the column parallel processing unit 102 is connected to the bus 103 for each of columns by signal lines 123-1 to 123-M. Hereinafter, in a case where it is not necessary to distinguish the signal lines 123-1 to 123-M from each other, they will each be referred to as the signal line(s) 123. The column parallel processing unit 102 supplies a result of signal processing (for example, each of digital data obtained by each of A/D conversion) for each of columns obtained to the bus 103 via the signal line 123 (any of the signal lines 123-1 to 123-M).

Each of digital data supplied from the column parallel processing unit 102 to the bus 103 via the signal line 123 is sequentially transferred to the output terminal 104 via the bus 103 and is output to the outside of the image sensor 100 via the output terminal 104.

The system control unit 111 supplies a control signal via the control line 131 so as to control the column parallel processing unit 102. Furthermore, the system control unit 111 supplies a control signal via the control line 132 so as to control the row scanning unit 112. Furthermore, the system control unit 111 supplies a control signal via the control line 133 so as to control the column scanning unit 113. In this manner, the system control unit 111 controls individual portion of the image sensor 100 so as to control operation (operation of individual portions) of the entire image sensor 100. Note that while FIG. 1 illustrates each of the control lines 131 to 133 described above by a single dotted line (dotted arrow), each of these control lines may be constituted by a plurality of control lines.

Under the control of the system control unit 111, the row scanning unit 112 supplies control signals via the control lines 124-1 to 124-N so as to control the unit pixels 121 of the pixel array 101 for each of the unit pixel rows. Note that, hereinafter, in a case where it is not necessary to distinguish the control lines 124-1 to 124-N from each other, they each will be referred to as the control line(s) 124.

That is, the unit pixel 121 is connected to the vertical signal line 122 assigned to the column to which the unit pixel 121 belongs and connected to the control line 124 assigned to the unit pixel row to which the unit pixel 121 belongs. The unit pixel 121 is driven on the basis of a control signal supplied via the control line 124 and supplies an electric signal obtained by oneself to the column parallel processing unit 102 via the vertical signal line 122.

Under the control of the system control unit 111, the column scanning unit 113 supplies a control signal via the control lines 125-1 to 125-M so as to control operation of the column parallel processing unit 102 for each of columns. Note that hereinafter, in a case where it is not necessary to distinguish the control lines 125-1 to 125-M from each other, they each will be referred to as the control line(s) 125.

Note that while FIG. 1 illustrates the control line 124 of each of the unit pixel rows by one line, the control line 124 of each of the unit pixel rows may be constituted by a plurality of control lines. Furthermore, while the control line 125 of each of columns is illustrated as a single line, the control line 125 of each of columns may be constituted by a plurality of control lines.

<Unit Pixel Configuration>

Figure 2:
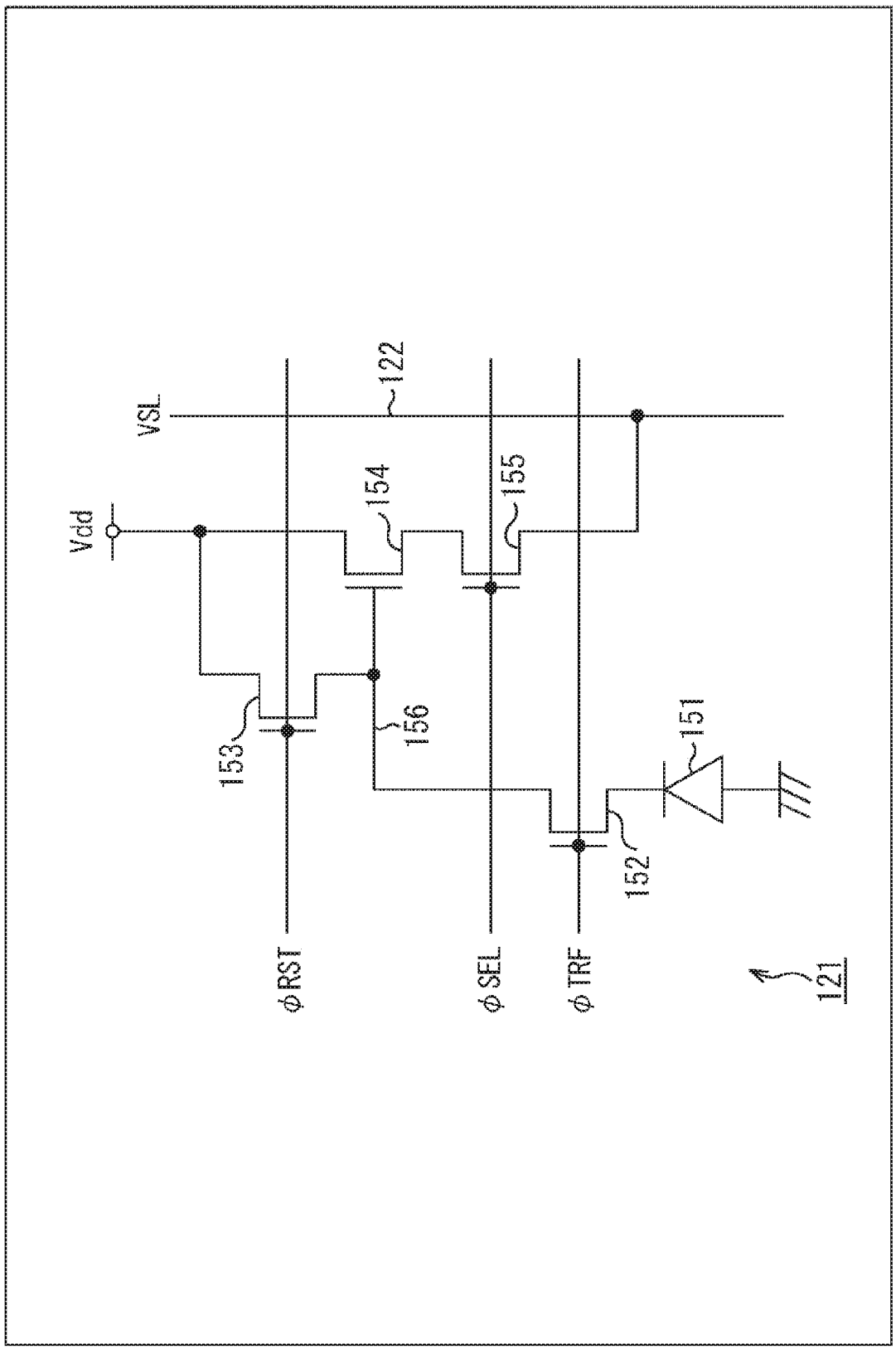
FIG. 2 is a diagram illustrating a main configuration example of a unit pixel.

FIG. 2 is a diagram illustrating an example of a main circuit configuration of the unit pixel 121. As illustrated in FIG. 2, the unit pixel 121 includes a photodiode (PD) 151, a transfer transistor 152, a reset transistor 153, an amplification transistor 154, a selection transistor 155, and a floating diffusion (FD) 156.

The photodiode 151 photoelectrically converts the received light into a photoelectric charge (here, photoelectron) having a charge amount according to the light amount, and accumulates the photoelectric charge. The accumulated photoelectric charge is read at a predetermined timing. The anode electrode of the photodiode 151 is connected to the ground (pixel ground) of the pixel region, while the cathode electrode is connected to the floating diffusion 156 via the transfer transistor 152. Furthermore, it is allowable, for example, to employ a system in which the cathode electrode of the photodiode 151 is connected to the power supply (pixel power supply) of the pixel region while the anode electrode is connected to the floating diffusion 156 via the transfer transistor 152, and the photoelectric charge is read as an optical hole.

The transfer transistor 152 controls reading of the photoelectric charge from the photodiode 151. In the transfer transistor 152, the drain electrode is connected to the floating diffusion while the source electrode is connected to the cathode electrode of the photodiode 151. Furthermore, a transfer control line (TRF) that transmits a transfer control signal supplied from the row scanning unit 112 is connected to the gate electrode of the transfer transistor 152. The transfer control line (TRF) is a control line included in the control line 124 in FIG. 1. When the signal of the transfer control line (TRF) (namely, the gate potential of the transfer transistor 152) is in an off state, photoelectric charge is not transferred from the photodiode 151 (photoelectric charge is accumulated in the photodiode 151). In contrast, when the signal of the transfer control line (TRF) is in an on state, the photoelectric charge accumulated in the photodiode 151 is transferred to the floating diffusion 156.

The reset transistor 153 resets the potential of the floating diffusion 156. In the reset transistor 153, the drain electrode is connected to the power supply potential, while the source electrode is connected to the floating diffusion 156. Furthermore a reset control line (RST) that transmits a reset control signal supplied from the row scanning unit 112 is connected to the gate electrode of the reset transistor 153. The reset control line (RST) is a control line included in the control line 124 in FIG. 1. When the signal of the reset control line (RST) (namely, the gate potential of the reset transistor 153) is in an off state, the floating diffusion 156 is disconnected from the power supply potential. In contrast, when the signal of the reset control line (RST) is in an on state, the charge of the floating diffusion 156 is discarded to the power supply potential, and the floating diffusion 156 is reset.

The amplification transistor 154 amplifies the potential change of the floating diffusion 156 and outputs it as an electric signal (analog signal). In the gate electrode of the amplification transistor 154, the gate electrode is connected to the floating diffusion 156, the drain electrode is connected to the source follower power supply voltage, and the source electrode is connected to the drain electrode of the selection transistor 155. For example, the amplification transistor 154 outputs the potential of the floating diffusion 156 reset by the reset transistor 153 to the selection transistor 155 as a reset signal (reset level). Furthermore, the amplification transistor 154 outputs the potential of the floating diffusion 156 to which the photoelectric charge has been transferred by the transfer transistor 152, to the selection transistor 155, as a light accumulation signal (signal level).

The selection transistor 155 controls the output of the electric signal supplied from the amplification transistor 154 to the vertical signal line (VSL) 122 (namely, column parallel processing unit 102). In the selection transistor 155, the drain electrode is connected to the source electrode of the amplification transistor 154, while the source electrode is connected to the vertical signal line 122. Furthermore, a selection control line (SEL) that transmits a selection control signal supplied from the row scanning unit 112 is connected to the gate electrode of the selection transistor 155. The selection control line (SEL) is a control line included in the control line 125 in FIG. 1.

When the signal of the selection control line (SEL) (that is, the gate potential of the selection transistor 155) is in an off state, the amplification transistor 154 and the vertical signal line 122 are electrically disconnected from each other. Accordingly, no reset signal, pixel signal, or the like, are output from the unit pixel 121. In contrast, when the selection control line (SEL) is in an on state, the unit pixel 121 is in a selected state. That is, the amplification transistor 154 and the vertical signal line 122 are electrically connected to each other, allowing a signal output from the amplification transistor 154 to be supplied to the vertical signal line 122 as a signal of the unit pixel 121. In other words, a reset signal, a pixel signal, or the like are read from the unit pixel 121.

The floating diffusion (FD) 156 is a charge accumulation unit that holds the electric charge read from the photodiode 151. As described above, for example, the potential change of the floating diffusion 156 is amplified by the amplification transistor 154 and output as an analog signal. Furthermore, the potential of the floating diffusion 156 is reset by the reset transistor 153, for example.

Note that the configuration of the unit pixel 121 is arbitrary, and is not limited to the example of FIG. 2. For example, it is possible to adopt various pixel configurations such as a 5-transistor type pixel configuration, a floating diffusion sharing type pixel configuration, a transistor sharing type pixel configuration, and a memory mounted global shutter operable pixel configuration.

<Column Parallel Processing Unit>

Figure 3:
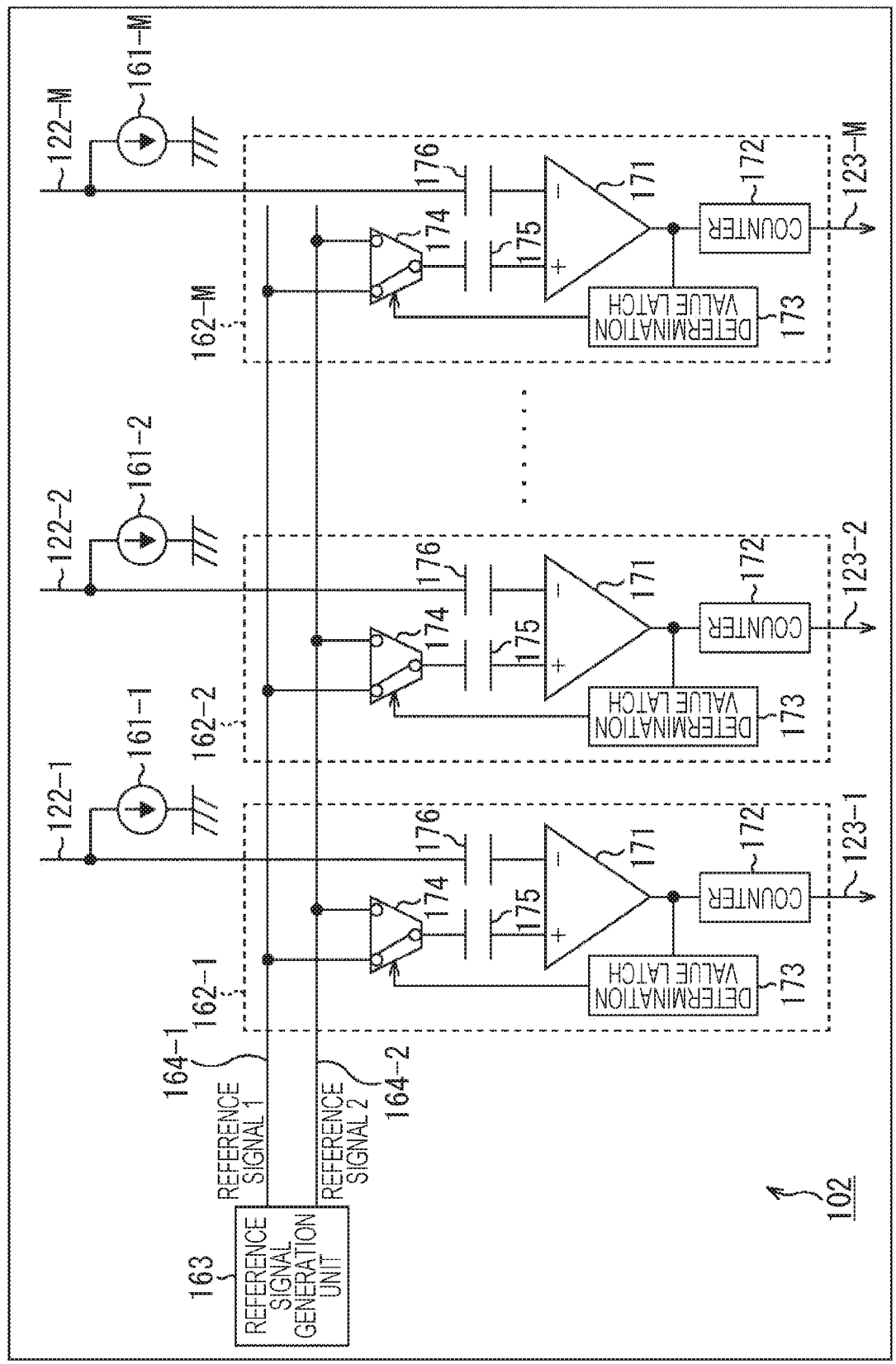
FIG. 3 is a diagram illustrating a main configuration example of a column parallel processing unit.

FIG. 3 is a diagram illustrating a main configuration example of the column parallel processing unit 102. As illustrated in FIG. 3, the column parallel processing unit 102 includes bias circuits 161-1 to 161-M. Hereinafter, in a case where it is not necessary to distinguish the bias circuits 161-1 to 161-M from each other, they each will be referred to as the bias circuit(s) 161. The bias circuit 161 is provided for each of the vertical signal lines 122 (that is, for each of columns). Each vertical signal line 122 is controlled to a predetermined voltage level by the bias circuit 161 corresponding to the own line.

Furthermore, the column parallel processing unit 102 includes a column A/D converter 162-1 to a column A/D converter 162-M. Hereinafter, in a case where it is not necessary to distinguish the column A/D converter 162-1 to the column A/D converter 162-M from each other, they each will be referred to as the column A/D converter(s) 162. The column A/D converter 162 is provided for each of vertical signal lines 122 (that is, for each of columns), and performs A/D conversion on an analog signal (for example, pixel signal supplied from each of unit pixels of that column) supplied via the vertical signal line 122 corresponding to the own converter. The column A/D converter 162 supplies the digital signal obtained by the A/D conversion to the bus 103 via the signal line 123 corresponding to the own converter.

Moreover, the column parallel processing unit 102 includes a reference signal generation unit 163, a reference signal line 164-1 and a reference signal line 164-2. The reference signal generation unit 163 generates a reference signal used by each of column A/D converters 162. The reference signal generation unit 163 generates reference signals of two channels, namely, a reference signal 1 and a reference signal 2. The reference signal 1 and the reference signal 2 are ramp waveform signals, and the gradient of the slope of the waveform is different from each other. The reference signal 1 is supplied to each of column A/D converters 162 via the reference signal line 164-1. The reference signal 2 is supplied to each of column A/D converters 162 via the reference signal line 164-2. Hereinafter, in a case where it is not necessary to distinguish the reference signal line 164-1 and the reference signal line 164-2 from each other, they each will be referred to as the reference signal line(s) 164.

The column A/D converter 162 performs A/D conversion on the analog signal supplied via the vertical signal line 122 using the reference signal of such a ramp wave system. That is, the column A/D converter 162 compares the reference signal with the analog signal and outputs a length of a period until the comparison result is inverted, as digital data (that is, an A/D conversion result of the analog signal). As described above, the reference signal 1 and the reference signal 2 have mutually different gradients of slopes. The column A/D converter 162 selects and uses the reference signal having an appropriate gradient of slope with respect to the analog signal to undergo A/D conversion from among the reference signals of two channels (reference signal 1 and reference signal 2). That is, in A/D conversion of analog signals, the column A/D converter 162 can adaptively switch the gradients of slopes of the reference signals in accordance with the signal level of the analog signal. This enables the column A/D converter 162 to implement A/D conversion with high speed, a high dynamic range, and higher accuracy regardless of the signal level of the analog signal to undergo A/D conversion.

Note that, although not illustrated, the reference signal generation unit 163 is driven on the basis of a control signal (that is, control by the system control unit 111) supplied from the system control unit 111 via the control line 131. Furthermore, the column A/D converter 162 is driven on the basis of a control signal (that is, control by the column scanning unit 113) supplied from the column scanning unit 113 via the control line 125.

The column A/D converter 162 includes a comparator 171, a counter 172, a determination value latch 173, a selector 174, a capacitor 175, and a capacitor 176.

The comparator 171 compares the signal levels of the signals input to the two input terminals and outputs a comparison result from one output terminal. One input terminal of the comparator 171 is connected to the selector 174 via the capacitor 175. The reference signal 1 or the reference signal 2 is input to this input terminal. Furthermore, the other input terminal of the comparator 171 is connected to the vertical signal line 122 via the capacitor 176, and an analog signal supplied from the unit pixel of the corresponding column is input to this input terminal. That is, the comparator 171 compares the signal level of the reference signal 1 or the reference signal 2 with the signal level of the analog signal supplied via the vertical signal line 122. The comparator 171 supplies information indicating which of the signals has a higher signal level to the counter 172 and the determination value latch 173 as a comparison result.

For example, the comparison result is 1-bit digital data. In a case where the signal level of the reference signal is greater than the signal level of the analog signal, for example, the value of the comparison result is "0", and the value is "1" in an opposite case. Of course, this value can be set in the reversed manner. Furthermore, the bit length of this comparison result is arbitrary, and the result may be information formed with a plurality of bits.

In the counter 172, its input terminal is connected to the output terminal of the comparator 171, and its output terminal is connected to the signal line 123 of the column corresponding to the own counter. The comparison result is supplied from the comparator 171 to the counter 172. The counter 172 measures (for example, counts the number of clocks of the predetermined clock signal) the time from the start of counting until the comparison result is inverted (signal level of the output signal from the comparator 171 changes). Then, the counter 172 supplies the count value up to the point of inversion of the comparison result as an A/D conversion result (digital data) of the analog signal read from the unit pixel 121 to the bus 103 via the signal line 123.

The determination value latch 173 holds the comparison result supplied from the comparator 171. The determination value latch 173 generates a control signal for controlling the operation (selection) of the selector 174 on the basis of the comparison result that has been held or under the control of the column scanning unit 113 (system control unit 111), and supplies the control signal to the selector 174.

In the selector 174 having a 2-input 1-output configuration, its one input is connected to the reference signal line 164-1, while its other input terminal is connected to the reference signal line 164-2, with the output terminal being connected to one input terminal of the comparator 171 via the capacitor 175. The selector 174 selects the reference signal to be supplied to the comparator 171 on the basis of the control signal supplied from the determination value latch 173.

The capacitor 175 is provided between the output terminal of the selector 174 and one input terminal of the comparator 171. The capacitor 176 is provided between the vertical signal line 122 and the other input terminal of the comparator 171. The capacitor 175 and the capacitor 176 are capacitive elements for analog CDS that cancels element variation being analog.

For example, the determination value latch 173 causes the selector 174 to select the reference signal 1 in a first P phase of the correlated double sampling (CDS), and causes the selector 174 to select the reference signal 2 in a second P phase. The comparator 171 sequentially compares the reset signal with these reference signals. That is, A/D conversion of the reset signal is performed using each of the reference signals.

Furthermore, for example, the determination value latch 173 causes the selector 174 to select the reference signal corresponding to the signal level of the pixel signal in a D phase of the CDS. That is, the selector 174 selects either the reference signal 1 or the reference signal 2 (that is, gradient of the slope of the reference signal) in accordance with the comparison result (that is, magnitude of the signal level of the analog signal). Then, the comparator 171 compares the pixel signal with the selected reference signal, and the counter 172 counts the period until the comparison result is inverted. That is, A/D conversion of the pixel signal is performed using the reference signal corresponding to the signal level.

With this operation, the column A/D converter 162 can perform A/D conversion of the pixel signal using a more appropriate reference signal (reference signal having a slope of a more appropriate gradient, for example) toward the signal level of the pixel signal in the D phase. That is, this enables the column A/D converter 162 to omit the A/D conversion using unnecessary reference signals in the D phase and enables implementation of A/D conversion with high speed and high dynamic range, and higher accuracy.

<Reference Signal Generation Unit>

Figure 4:
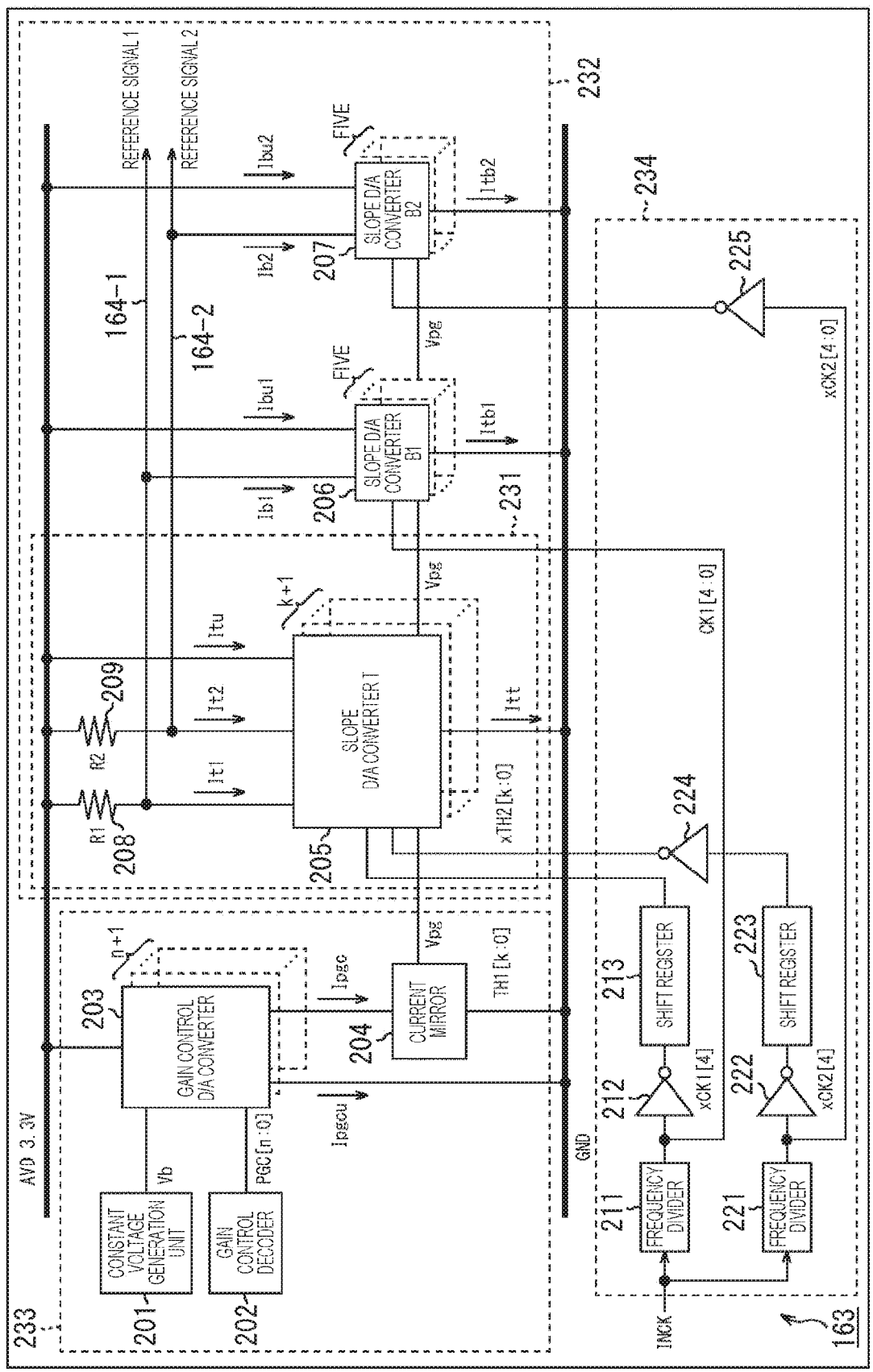
FIG. 4 is a diagram illustrating a main configuration example of a reference signal generation unit.

FIG. 4 is a block diagram illustrating a main configuration example of the reference signal generation unit 163. As illustrated in FIG. 4, the reference signal generation unit 163 includes a constant voltage generation unit 201, a gain control decoder 202, a gain control D/A converter 203, and a current mirror 204. The reference signal generation unit 163 further includes a slope D/A converter T205, a slope D/A converter B206 (slope D/A converter B1), a slope D/A converter B207 (slope D/A converter B2), a resistor 208, and a resistor 209. The reference signal generation unit 163 further includes a frequency divider 211, a NOT gate 212, a shift register 213, a frequency divider 221, a NOT gate 222, a shift register 223, a NOT gate 224, and a NOT gate 225.

The constant voltage generation unit 201 generates a constant voltage Vb and supplies it to the gain control D/A converter 203. The gain control decoder 202 decodes a gain control signal (not illustrated) supplied from the system control unit 111 to generate (n+1) gain control signals PGC [n:0], and supplies the generated signal to the gain control D/A converter 203.

The gain control D/A converter 203 generates a current according to the constant voltage Vb supplied from the constant voltage generation unit 201, and divides the current into a current Ipgcu and a current Ipgc in a ratio according to the value of the gain control signal PGC [n:0] supplied from the gain control decoder 202. The gain control D/A converter 203 includes (n+1) configurations arranged in parallel so as to generate a current corresponding to the constant voltage Vb and assign the current to the current Ipgcu or the current Ipgc. n is an arbitrary natural number. That is, the number of this configuration is arbitrary. Each of the (n+1) configurations assigns a current in accordance with the value corresponding to the own configuration among the gain control signals PGC [n:0], allowing the current corresponding to the constant voltage Vb as a whole to be divided into the current Ipgcu and the current Ipgc in a ratio according to the value of the gain control signal PGC [n:0]. In other words, the sum of the current Ipgcu and the current Ipgc (that is, the current corresponding to the constant voltage Vb) is constant regardless of the code of the gain control signal. The current Ipgcu is output to the ground (GND), and the current Ipgc is supplied to the current mirror 204.

The current mirror 204 converts the current Ipgc into a voltage and generates a bias voltage Vpg. The bias voltage Vpg is supplied to the slope D/A converter T205, the slope D/A converter B206, and the slope D/A converter 207.

The slope D/A converter T205 generates a current Itt according to the bias voltage Vpg, and divides the current Itt into a current It1, a current It2, and a current Itu in a ratio according to the values of a digital signal TH1 [k:0] and a digital signal xTH2 [k:0]. The slope D/A converter T205 includes (k+1) configurations arranged in parallel so as to generate the current Itt corresponding to the bias voltage Vpg and assign the current Itt to any of the current It1, the current It2, and the current Itu. k is an arbitrary natural number. That is, the number of this configuration is arbitrary. With individual assignment of the current Itt in accordance with the value corresponding to the own configuration among the digital signal TH1 [k:0] and the digital signal xTH2 [k:0] by this (k+1) configuration, the current Itt according to the bias voltage Vpg as a whole is divided into the current It1, the current It2, and the current Itu in a ratio according to the values of the digital signal TH1 [k:0] and the digital signal xTH2 [k:0]. In other words, Itt=It1+It2+Itu is established regardless of the values of the digital signal TH1 [k:0] and the digital signal xTH2 [k:0].

A resistor 208 having a resistance value R1 and a reference signal line 164-1 are connected to the signal line that carries the current It1. The current It1 is converted into a voltage by the resistor 208, and is output as an analog signal (reference signal 1) from the signal line 164-1. Furthermore, a resistor 209 having a resistance value R2 and a reference signal line 164-2 are connected to the signal line that carries the current It2. The current It2 is converted into a voltage by the resistor 209, and is output as an analog signal (reference signal 2) from the signal line 164-2. As described above, the reference signal 1 and the reference signal 2 are supplied to the column A/D converter 162. Furthermore, the signal line that carries the current Itu is connected to a power supply potential AVD (for example, 3.3V).

That is, the current It1 and the current It2 are the output currents to be output, and the current Itu is the non-output current (also referred to as a discard current) that is not to be output. That is, the slope D/A converter T205 generates the predetermined current Itt according to the bias voltage Vpg, and divides the current Itt into the plurality of output currents (current It1 and current It2) and the non-output current (current Itu) at a ratio according to the values of the digital signal TH1 [k:0] and the digital signal xTH2 [k:0]

Then, the plurality of output currents is converted into voltages and output as analog signals (reference signal 1 and reference signal 2).

The slope D/A converter B206 (slope D/A converter B1) is a binary code current source for the reference signal 1. The slope D/A converter B206 generates a current Itb1 according to the bias voltage Vpg, and divides the current Itb1 into a current Ib1 and a current Ibu1 in a ratio according to the value of a digital signal CK1 [4:0]. The slope D/A converter B206 controls a lower bit of the signal level of the reference signal 1 by the current Ib1, for example. In the slope D/A converter B206, five configurations to generate the current Itb1 according to the bias voltage Vpg and assign the current Itb1 to the current Ib1 and the current Ibu1 are arranged in parallel. With individual assignment of the current Itb1 in accordance with the value corresponding to the own configuration among the digital signal CK1 [4:0] by five configurations, the current Itb1 according to the bias voltage Vpg as a whole is divided into the current Ib1 and the current Ibu1 in a ratio according to the values of the digital signal CK1 [4:0]. In other words, Itb1=Ib1+Ibu1 is established regardless of the value of the digital signal CK1 [4:0]. In this case, the slope D/A converter B206 controls a lower five bits of the signal level of the reference signal 1, for example.

Similarly, the slope D/A converter B207 (slope D/A converter B2) is a binary code current source for the reference signal 2. The slope D/A converter B207 generates a current Itb2 corresponding to the bias voltage Vpg, and divides the current Itb2 into a current Ib2 and a current Ibu2 in a ratio according to the value of the digital signal CK2 [4:0]. The slope D/A converter B207 controls a lower bit of the signal level of the reference signal 2 by the current Ib2, for example. The slope D/A converter B207 includes five configurations arranged in parallel so as to generate a current the Itb2 corresponding to the bias voltage Vpg and assign the current Itb2 to the current Ib2 and the current Ibu2. With individual assignment of the current Itb2 in accordance with the value corresponding to the own configuration among the digital signals CK2 [4:0] by five configurations, the current Itb2 according to the bias voltage Vpg as a whole is divided into the current Ib2 and the current Ibu2 in a ratio according to the values of the digital signals CK2 [4:0]. In other words, Itb2=Ib2+Ibu2 is established regardless of the value of the digital signal CK2 [4:0]. In this case, the slope D/A converter B207 controls a lower five bits of the signal level of the reference signal 2, for example.

The current Ib1 is converted into a voltage by the resistor 208, and is output from the reference signal line 164-1 as an analog signal (reference signal 1). The voltage of the reference signal 1 is calculated as AVD−(It1+Ib1)×R1. The current Ib2 is converted into a voltage by the resistor 209, and is output from the reference signal line 164-2 as an analog signal (reference signal 2). The voltage of the reference signal 2 is calculated as AVD−(It2+Ib2)×R2. Note that the signal line that carries the current Ibu1 and the signal line that carries the current Ibu2 flows are connected to the power supply potential AVD (for example, 3.3V).

That is, the current Ib1 is the output current to be output, and the current Ibu1 is the non-output current (also referred to as a discard current) that is not to be output. That is, the slope D/A converter B206 generates the predetermined current Itb1 according to the bias voltage Vpg, and divides the current Itb1 into the single output current (current Ib1) and the non-output current (current Ibu1) in a ratio according to the value of the digital signal CK1 [4:0]. Then, this single output current (current Ib1) is converted into voltage and is output as an analog signal (reference signal 1). That is, the slope D/A converter B206 uses this single output current (current Ib1) to control the signal level of the analog signal (reference signal 1) output from the slope D/A converter T205.

Similarly, the current Ib2 is an output current to be output, and the current Ibu2 is a non-output current (also referred to as a discard current) that is not to be output. That is, the slope D/A converter B207 generates the predetermined current Itb2 according to the bias voltage Vpg and divides the current Itb2 into the single output current (current Ib2) and the non-output current (current Ibu2) in a ratio according to the value of the digital signal xCK2 [4:0]. Then, this single output current (current Ib2) is converted into voltage and is output as an analog signal (reference signal 2). That is, the slope D/A converter B207 uses this single output current (current Ib2) to control the signal level of the analog signal (reference signal 2) output from the slope D/A converter T205.

Note that the parallel number of the slope D/A converter B206 and the slope D/A converter B207 is arbitrary, and may be other than five.

The resistor 208 is a resistor of a resistance value R1, connected to the power supply potential AVD on one end, and connected to the signal line that carries the current It1 and the reference signal line 164-1 that carries the reference signal 1 on the other end. That is, the resistor 208 converts the current It1 and the current Ib1 into voltage. The resistor 209 is a resistor of a resistance value R2, connected to the power supply potential AVD on one end, and connected to the signal line that carries the current It2 and the reference signal line 164-2 that carries the reference signal 2 on the other end. That is, the resistor 209 converts the current It2 and the current Ib2 into voltage. The resistance value R1 of the resistor 208 and the resistance value R2 of the resistor 209 may be different from each other.

The frequency divider 211 divides the frequency of an input clock INCK to generate a digital signal CK1 [4:0]. The NOT gate 212 inverts the digital signal CK1 [4] among them, and generates the digital signal xCK1 [4]. The shift register 213 generates the digital signal TH1 [k:0] using the digital signal xCK1 [4]. The shift register 213 supplies the digital signal TH1 [k:0] to the slope D/A converter T205. Furthermore, the frequency divider 211 supplies the generated digital signal CK1 [4:0] to the slope D/A converter B206 (slope D/A converter B1).

The frequency divider 221 divides the frequency of the input clock INCK to generate a digital signal CK2 [4:0]. With setting the frequency division ratios of the frequency divider 211 and the frequency divider 221 to mutually different values, the digital signal CK1 [4] and the digital signal CK2 [4] can have different frequencies. The NOT gate 222 inverts the digital signal CK2 [4] among signals, and generates the digital signal xCK2 [4]. The shift register 223 generates the digital signal TH2 [k:0] using the digital signal xCK2 [4]. The NOT gate 224 inverts the digital signal TH2 [k:0] to generate the digital signal xTH2 [k:0]. The NOT gate 224 supplies the digital signal xTH2 [k:0] to the slope D/A converter T205. Furthermore, the NOT gate 225 inverts the digital signal CK2 [4:0] generated by the frequency divider 221 to generate the digital signal xCK2 [4:0]. The NOT gate 225 supplies the generated digital signal xCK2 [4:0] to the slope D/A converter B207 (slope D/A converter B2).

Note that as illustrated by the dotted line in FIG. 4, the resistor 208 and the resistor 209 may be added to the slope D/A converter T205 to form a slope D/A converter T231. The slope D/A converter T231 may perform D/A conversion on the digital signal TH1 [k:0] and the digital signal xTH2 [k:0] to output the reference signal 1 and the reference signal 2 as analog signals. Furthermore, as illustrated by a dotted line in FIG. 4, the slope D/A converter B206 and the slope D/A converter B207 may be added to the configuration of the slope D/A converter T231 to form a slope D/A converter 232 The slope D/A converter 232 can perform D/A conversion on the digital signal TH1 [k:0], the digital signal xTH2 [k:0], the digital signal CK1 [4:0], and the digital signal xCK2 [4:0], and can output the reference signal 1 and the reference signal 2 including lower bits as analog signals.

Note that, as illustrated by the dotted line in FIG. 4, the constant voltage generation unit 201, the gain control decoder 202, the gain control D/A converter 203, and the current mirror 204 may be collectively defined as a gain control unit 233. The gain control unit 233 generates a bias voltage Vpg in accordance with the input gain control signal and supplies the generated bias voltage Vpg to the slope D/A converter 232 (slope D/A converter T205, the slope D/A converter B206, and the slope D/A converter B207).

Furthermore, as illustrated by the dotted line in FIG. 4, the frequency divider 211, the NOT gate 212, the shift register 213, the frequency divider 221, the NOT gate 222, the shift register 223, the NOT gate 224, and the NOT gate 225 may be collectively defined as a digital signal generation unit 234. The digital signal generation unit 234 uses the input clock INCK to generate the digital signal TH1 [k:0], the digital signal xTH2 [k:0], digital signals CK1 [4:0], and the digital signals xCK2 [4:0], and supplies the generated signals to the slope D/A converter 232.

<Gain Control D/A Converter>

Figure 5:
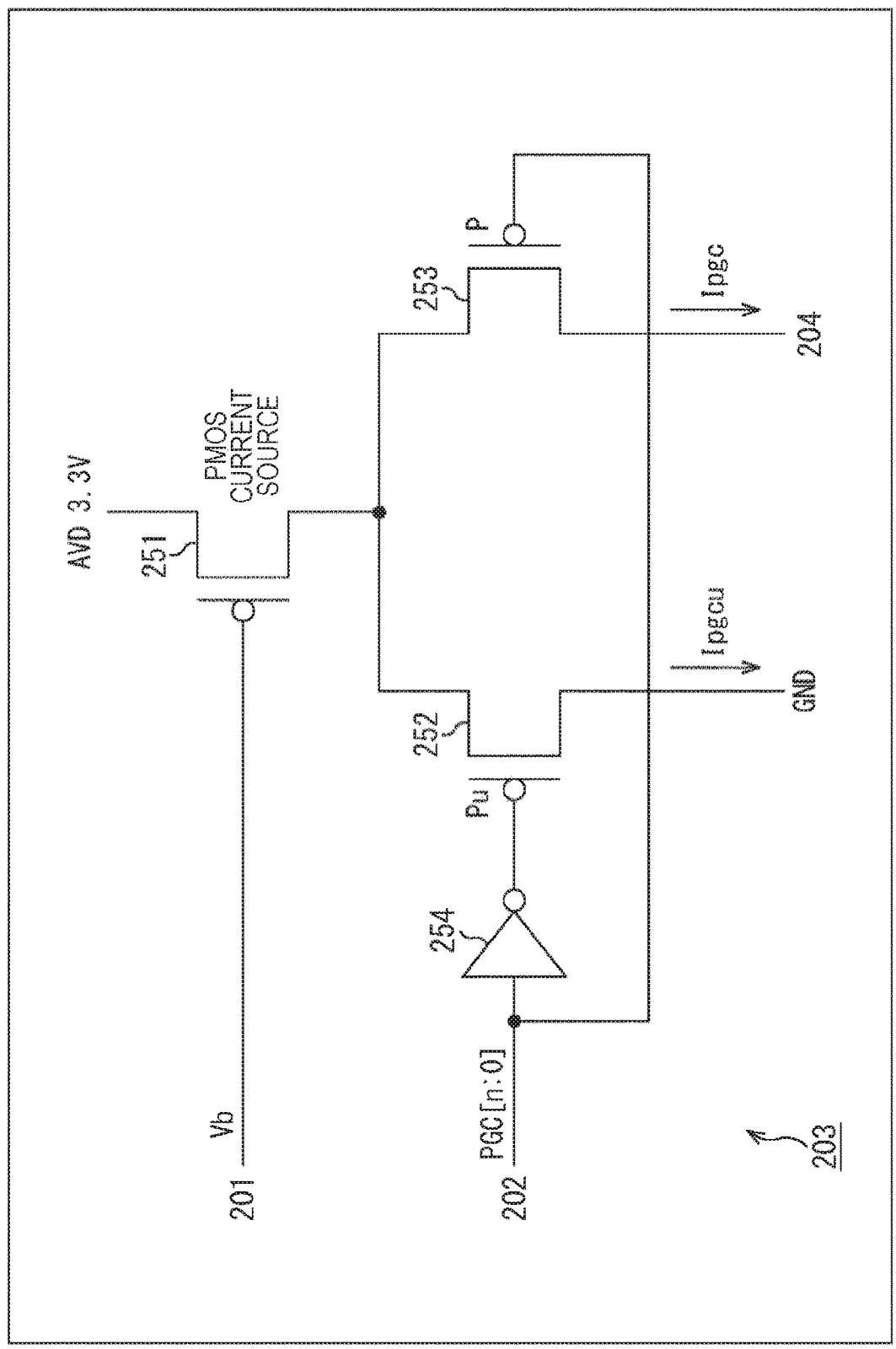
FIG. 5 is a diagram illustrating a main configuration example of a gain control D/A converter.

FIG. 5 is a diagram illustrating a main configuration example of the gain control D/A converter 203. FIG. 5 illustrates simply one of the (n+1) configurations arranged in parallel in the gain control D/A converter 203. The other n configurations are similar to the configuration illustrated in FIG. 5, and thus their description will be omitted.

As illustrated in FIG. 5, the gain control D/A converter 203 includes a PMOS current source 251. The PMOS current source 251 generates a current according to the constant voltage Vb input as a bias voltage. Furthermore, the gain control D/A converter 203 includes a switch 252 and a switch 253. The switch 252 and the switch 253 are arranged in parallel, and are controlled to set one is on and the other is off using a NOT gate 254 That is, the path that carries the current generated by the PMOS current source 251 is selected. For example, in a case where the switch 252 is on (switch 253 is off), the current generated by the PMOS current source 251 flows toward the ground potential (GND) as the current Ipgcu. Furthermore, in a case where the switch 252 is off (switch 253 is on), for example, the current generated by the PMOS current source 251 flows toward the current mirror 204 as the current Ipgc.

The switch 252 and the switch 253 is controlled by the digital signal PGC [n:0]. In each of such (n+1) configurations arranged in parallel, the path that carries the current generated by the PMOS current source 251 is selected so as to allow the current generated by the PMOS current source 251 to be divided into a current Ipgcu and a current Ipgc in a ratio according to the value of the digital signal PGC [n:0].

<Current Mirror>

Figure 6:
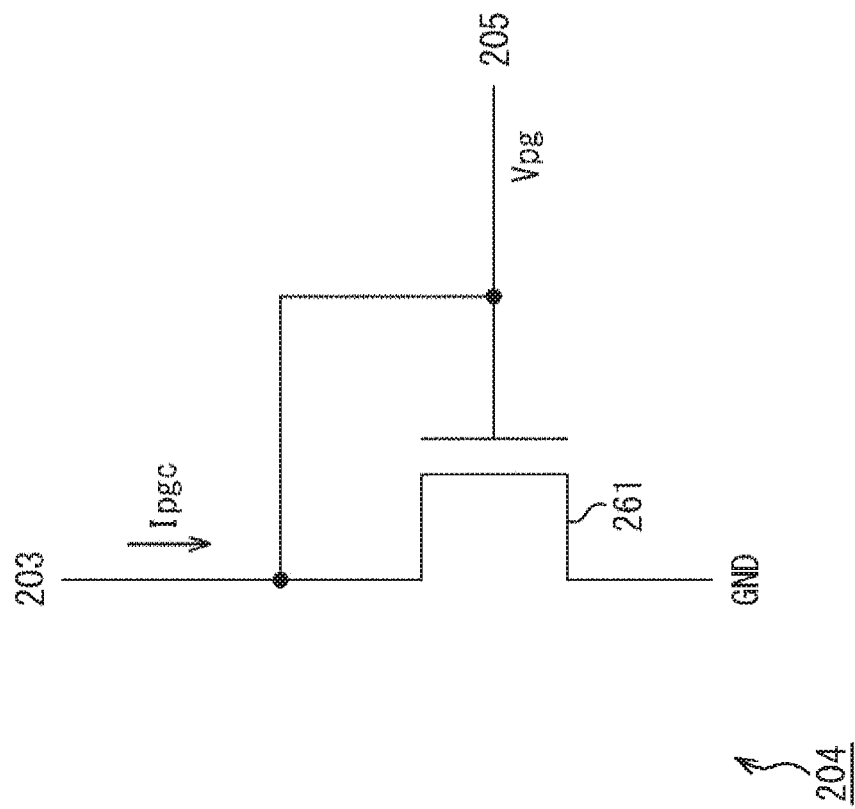
FIG. 6 is a diagram illustrating a main configuration example of a current mirror.

FIG. 6 is a diagram illustrating a main configuration example of the current mirror 204. As illustrated in FIG. 6, the current mirror 204 includes an NMOSFET 261, and uses the NMOSFET 261 to convert the current Ipgc into the bias voltage Vpg. The bias voltage Vpg is supplied to the slope D/A converter T205, the slope D/A converter B206, and the slope D/A converter B207, for example.

<Slope D/A Converter T>

Figure 7:
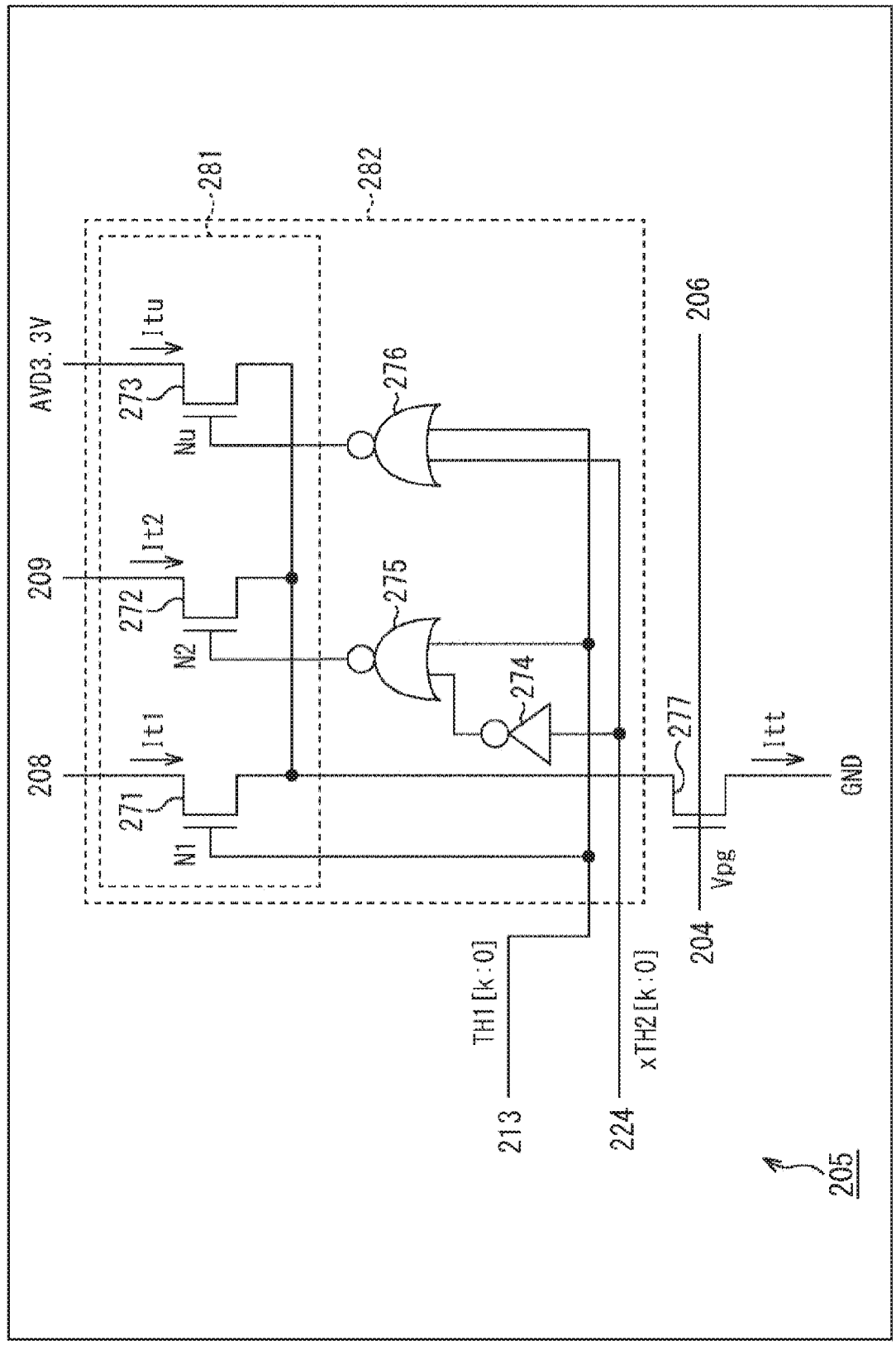
FIG. 7 is a diagram illustrating a main configuration example of a slope D/A converter T.

FIG. 7 is a diagram illustrating a main configuration example of the slope D/A converter T205. FIG. 7 illustrates simply one of the (k+1) configurations arranged in parallel in the slope D/A converter T205. The other k configurations are similar to the configuration illustrated in FIG. 7, and thus their description will be omitted.

As illustrated in FIG. 7, the slope D/A converter T205 includes an NMOS switch 271, an NMOS switch 272, an NMOS switch 273, a NOT gate 274, a NOR gate 275, a NOR gate 276, and an NMOS current source 277 (NMOS current source T).

The NMOS current source 277 generates the current Itt according to the bias voltage Vpg. That is, the NMOS current source 277 receives a gain control signal and generates the predetermined current (current Itt). The NMOS switch 271 to the NMOS switch 273 control the path of the current Itt. The NMOS switch 271 controls connection between the NMOS current source 277 and the resistor 208. In other words, the NMOS switch 271 controls whether or not the current Itt is to be the current It1. The NMOS switch 272 controls connection between the NMOS current source 277 and the resistor 209. That is, the NMOS switch 272 controls whether or not the current Itt is to be the current It2. The NMOS switch 273 controls connection between the NMOS current source 277 and the power supply potential AVD. That is, the NMOS switch 273 controls whether or not the current Itt is to be the current Itu.

The NMOS switch 271 to the NMOS switch 273 are controlled such that any one of the switches is turned on by the digital signal TH1 [k:0] and the digital signal xTH2 [k:0]. The digital signal TH1 [k:0] supplied from the shift register 213 is supplied to the gate of the NMOS switch 271, one input terminal of the NOR gate 275, and one input terminal of the NOR gate 276. Furthermore, the digital signal xTH2 [k:0] supplied from the NOT gate 224 is supplied to the other input terminal of the NOT gate 274 and the NOR gate 276. The NOT gate 274 inverts the value of the digital signal xTH2 [k:0] and supplies the inverted value to the other input terminal of the NOR gate 275. The NOR gate 275 supplies the NOR of the digital signal TH2 [k:0] and the digital signal TH1 [k:0] to the gate of the NMOS switch 272. The NOR gate 276 supplies the NOR of the digital signal xTH2 [k:0] and the digital signal TH1 [k:0] to the gate of the NMOS switch 273.

In a case where the digital signal TH1 [k:0] is "1", for example, the NMOS switch 271 is turned on, while the NMOS switch 272 and the NMOS switch 273 are turned off. Furthermore, in a case where the digital signal TH1 [k:0] is "0", for example, the NMOS switch 271 is turned off. At this time, when the digital signal xTH2 [k:0] is "1", the NMOS switch 272 is turned on, while the NMOS switch 273 is turned off. Conversely, when the digital signal xTH2 [k:0] is "0", the NMOS switch 272 is turned off, while the NMOS switch 273 is turned on.

With this configuration, the current Itt is set to any of the current It1, the current It2, and the current Itu. That is, the NMOS switch 271 to the NMOS switch 273 select which of the current It1, the current It2, and the current Itu is set as the current Itt.

Note that as illustrated by the dotted line in FIG. 7, the NMOS switch 271 to the NMOS switch 273 may be collectively defined as a switch 281. That is, the switch 281 includes the switches that are driven with a digital signal TH1 [k:0] and a digital signal xTH2 [k:0] as control signals and that control connection between the signal line connected to each of the plurality of output signal lines (reference signal lines 164-1 and the reference signal line 164-2) that output analog signals, the signal line connected to the voltage source (power supply potential AVD), with the current source (NMOS current source 277). The configuration of the switch 281 can take any form as long as it is possible to select which of the current It1, the current It2, and the current Itu, is to be set as the current Itt, and the configuration is not limited to the example of the NMOS switch 271 to the NMOS switch 273 described above.

Furthermore, as illustrated by a dotted line in FIG. 7, the NOT gate 274, the NOR gate 275, and the NOR gate 276 may be further added to the configuration of the switch 281 so as to be a D/A converter 282. The D/A converter 282 can output the current It1 and the current It2 according to the digital signal TH1 [k:0] and the digital signal xTH2 [k:0].

As described above, the slope D/A converter T205 includes (k+1) configurations as illustrated in FIG. 7, arranged in parallel. The NMOS current sources 277 of the individual configurations are the same size (width W, length L, parallel number, or the like) with each other, and they individually carry equal currents. In each of such (k+1) configurations arranged in parallel, the path that carries the current generated by the NMOS current source 277 is selected. Accordingly, in the slope D/A converter T205 as a whole, the current Itt generated by the NMOS current source 277 is divided into the current It1, the current It2, and the current Itu in accordance with the selection ratio. That is, the current Itt is divided into the current It1, the current It2, and the current Itu in accordance with the ratio of the number of switches 281 connecting the NMOS current source 277 to the signal line carrying the current It1, the number of the switches 281 connecting the NMOS current source 277 to the signal line carrying the current It2, and the number of the switches 281 connecting the NMOS current source 277 to the signal line carrying the current Itu. In other words, the current Itt is divided into the current It1, the current It2, and the current Itu in accordance with the ratio of the number of the NMOS switches 271 in the on state, the number of the NMOS switches 272 in the on state, and the number of the NMOS switches 273 in the on state.

Figure 8B:
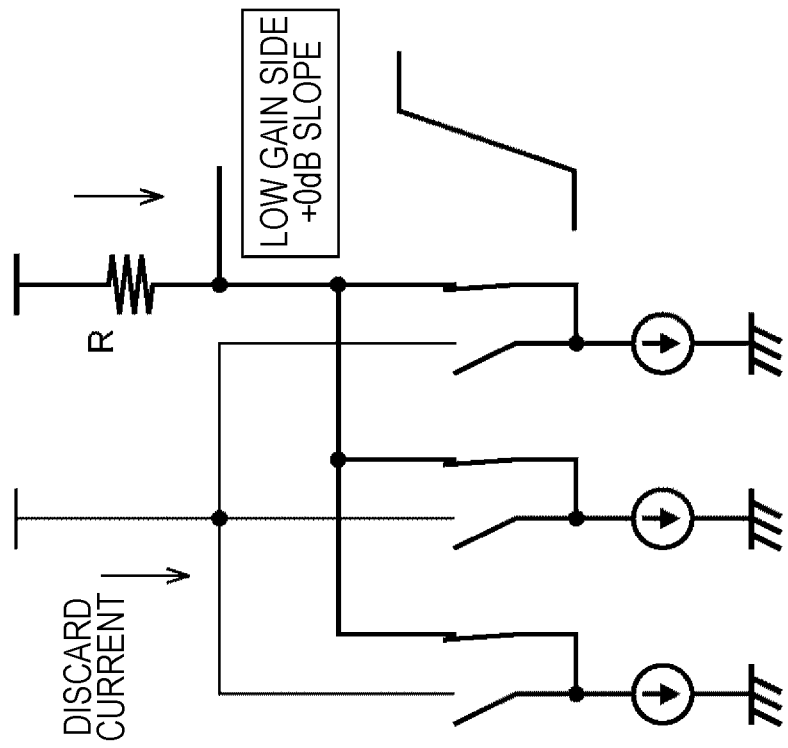
FIGS. 8A and 8B are diagrams for illustrating an example of a state of current division.
Figure 8A:
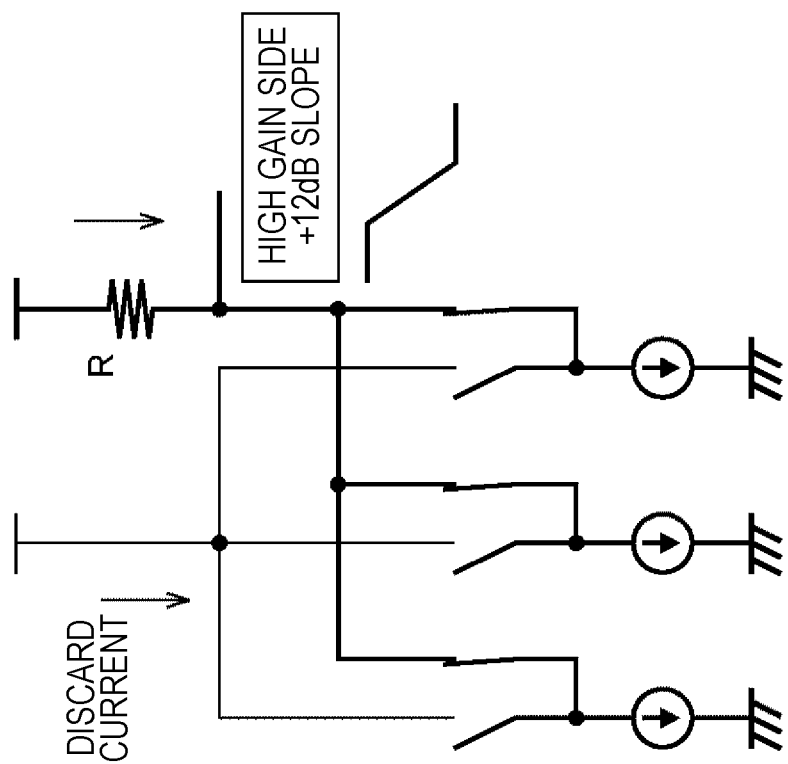

Conventionally, the slope D/A converter divides a predetermined current generated by receiving the gain control signal that controls the gain into a single output current and a non-output current (discard current). Therefore, there use to be a need to provide a slope D/A converter for individual gains, as illustrated in FIG. 8A and FIG. 8B. Therefore, this would lead to an increase in the circuit area and power consumption.

Figure 9:
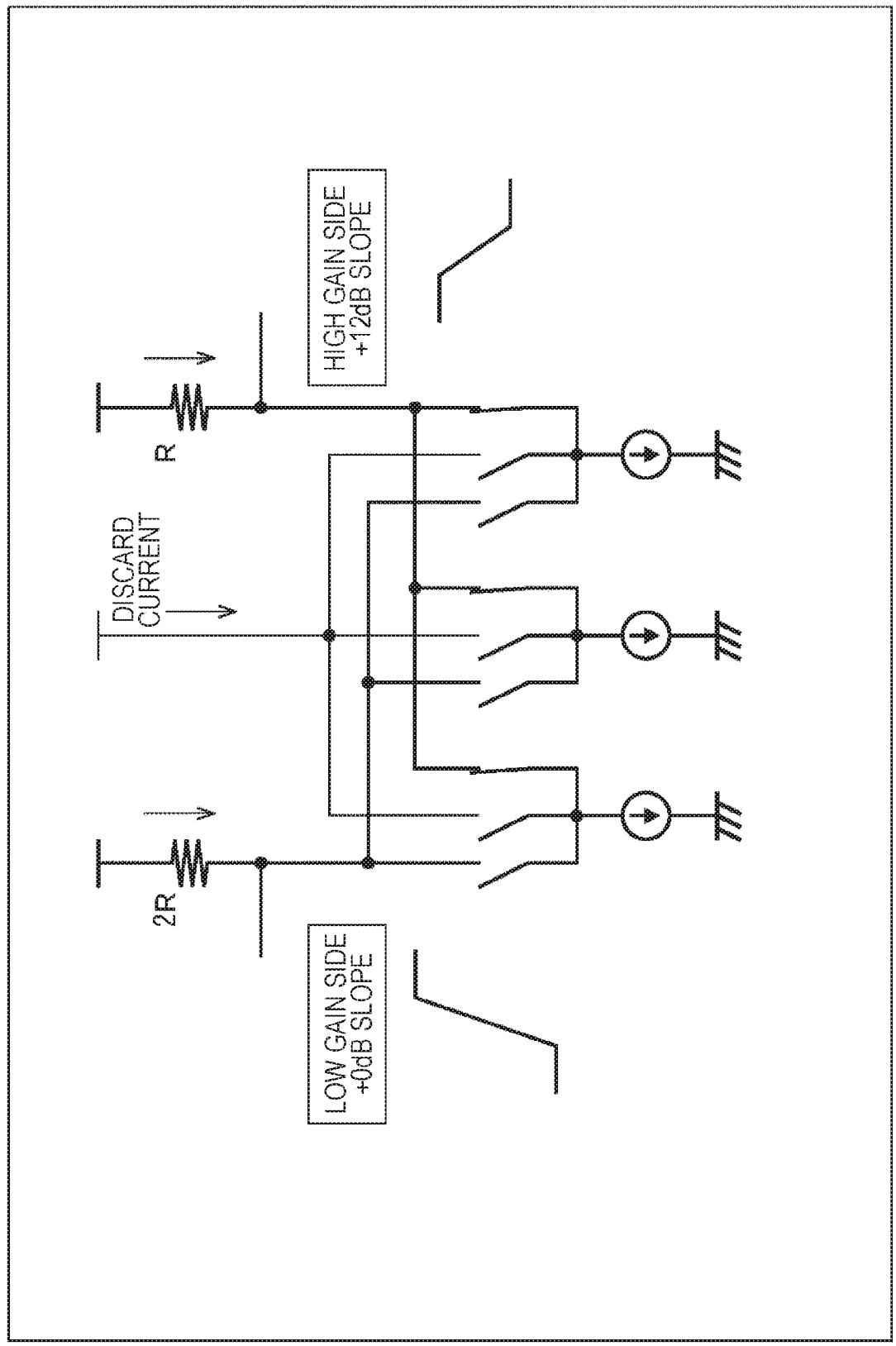
FIG. 9 is a diagram for illustrating an example of a state of current division.

In contrast, as illustrated in FIG. 9, the slope D/A converter T205 divides a predetermined current generated by receiving the gain control signal that controls the gain into the plurality of output currents and the non-output current in accordance with the value of the input digital signal.

Accordingly, the slope D/A converter T205 can further suppress an increase in the circuit area and power consumption, as compared with the case of the example in FIGS. 8A and 8B.

At that time, the slope D/A converter T205 recursively repeats the division of the current (non-output current) into the output current and the non-output current. For example, the slope D/A converter T205 divides a predetermined current into a first output current and a first non-output current in a ratio according to the value of the digital signal, and further divides the first non-output current into a second output current and a second non-output current in a ratio according to the value of the digital signal, and thus, outputs the first output current and the second output current, individually. The first output current and the second output current are converted into voltages by resistors and are output as analog signals.

More specifically, for example, the slope D/A converter T205 divides the current Itt into the current It1 and the current (Itt−It1) in a ratio according to the values of the digital signal TH1 [k:0] and the digital signal xTH2 [k:0]), and further divides the current (Itt−It1) into the current It2 and the current Itu in a ratio according to the values of the digital signal TH1 [k:0] and the digital signal xTH2 [k:0], and then, outputs the current It1 and current It2, individually. The current It1 and the current It2 are converted into voltages by the resistor 208 and the resistor 209 so as to be output as the reference signal 1 and the reference signal 2, respectively.

With this configuration, the slope D/A converter T205 can more easily divide the current generated by receiving the gain control signal into the plurality of output currents and the non-output current.

<Slope D/A Converter B>

Figure 10:
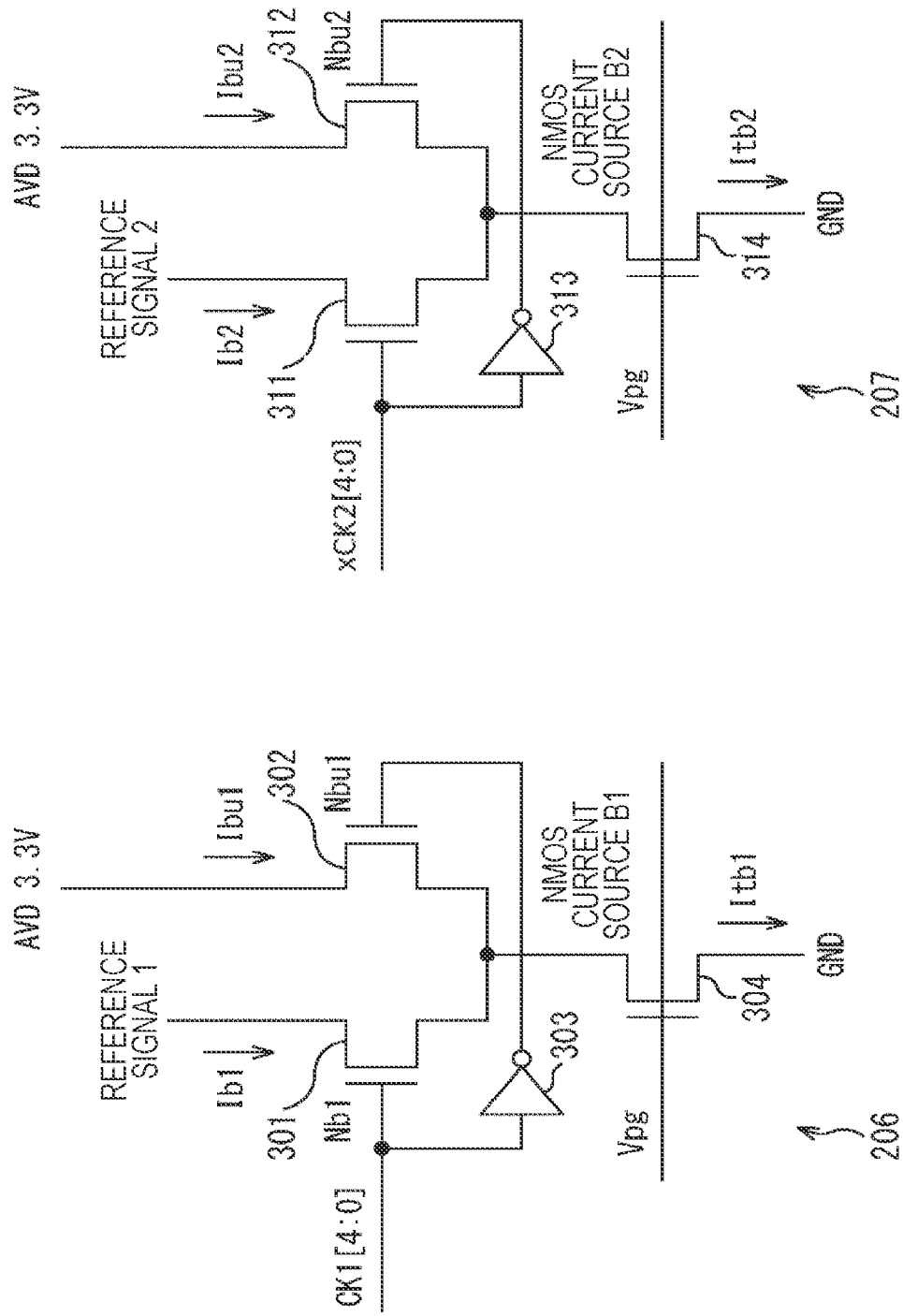
FIGS. 10A and 10B are diagrams illustrating a main configuration example of a slope D/A converter B.

FIGS. 10A and 10B are diagrams illustrating a main configuration example of the slope D/A converter B206 and the slope D/A converter B207. FIG. 10A is a diagram illustrating a main configuration example of the slope D/A converter B206. FIG. 10B is a diagram illustrating a main configuration example of the slope D/A converter B207. FIG. 10A and FIG. 10B each illustrates simply one of the five configurations arranged in parallel in the slope D/A converter B206 and the slope D/A converter B207.

As illustrated in FIG. 10A, the slope D/A converter B206 includes an NMOS switch 301, an NMOS switch 302, a NOT gate 303, and an NMOS current source 304.

The NMOS current source 304 (NMOS current source B1) generates a current Itb1 corresponding to the bias voltage Vpg. The NMOS switch 301 (Nb1) and the NMOS switch 302 (Nbu1) are arranged in parallel and controlled by the NOT gate 303 such that in a case that one is on, the other is off. That is, the path that carries the current Itb1 generated by the NMOS current source 304 is selected. For example, in a case where the NMOS switch 301 is on (the NMOS switch 302 is off), the current Itb1 flows from the reference signal line 164-1 toward the ground potential GND as the current Ib1. Furthermore, for example, in a case where the NMOS switch 301 is off (the NMOS switch 302 is on), the current Itb1 flows from the power supply potential AVD toward the ground potential GND as the current Ibu1. That is, whether the current Itb1 is to be the output current (current Ib1) or non-output current (current Ibu1) is selected depending on the states of the NMOS switch 301 (Nb1) and the NMOS switch 302 (Nbu1).

The NMOS switch 301 and the NMOS switch 302 are controlled by the digital signal CK1 [4:0]. Furthermore, the five configurations arranged in parallel as the slope D/A converter B206 has basically a configuration similar to that of FIG. 10A. In this, however, the size (parallel number or W/L) of the NMOS current source 304 is different from each other. For example, assuming that the size of the NMOS current source 277 is 1, the size of each of the NMOS current sources 304 may be set to ½×1/T1 times in accordance with a frequency ratio T1 of the digital signal CK1 [n] (n=0 to 4) and the digital signal CK1 [4]. For example, in the case of the configuration in which the digital signal CK1 [0] is input, the digital signal CK1 [0] has 16 times the frequency of the digital signal CK1 [4], and thus, the size of the NMOS current source 304 may be 1/32 times.

In each of the five such arrangements arranged in parallel, the path that carries the current generated by the NMOS current source 304 is selected. Accordingly, in the slope D/A converter B206, the current Itb1 generated by the NMOS current source 304 is divided into the current Ib1 and the current Ibu1 in accordance with the selection ratio. That is, the current Itb1 is divided into the current Ib1 and the current Ibu1 in accordance with the ratio between the number of the NMOS switches 301 in the on state and the number of the NMOS switches 302 in the on state.

As illustrated in FIG. 10B, the slope D/A converter B207 includes an NMOS switch 311, an NMOS switch 312, a NOT gate 313, and an NMOS current source 314.

The NMOS current source 314 (NMOS current source B2) generates a current Itb2 according to the bias voltage Vpg. The NMOS switch 311 (Nb2) and the NMOS switch 312 (Nbu2) are arranged in parallel and controlled by the NOT gate 313 such that in a case that one is on, the other is off. That is, the path that carries the current Itb2 generated by the NMOS current source 314 is selected. For example, in a case where the NMOS switch 311 is on (NMOS switch 312 is off), the current Itb2 flows from the reference signal line 164-2 toward the ground potential GND as the current Ib2. Furthermore, for example, in a case where the NMOS switch 311 is off (NMOS switch 312 is on), the current Itb2 flows from the power supply potential AVD toward the ground potential GND as the current Ibu2. That is, whether the current Itb2 is to be the output current (current Ib2) or non-output current (current Ibu2) is selected depending on the states of the NMOS switch 311 (Nb2) and the NMOS switch 312 (Nbu2).

The NMOS switch 311 and the NMOS switch 312 are controlled by the digital signal xCK2 [4:0]. Furthermore, the five configurations arranged in parallel as the slope D/A converter B207 have basically the configurations similar to that of FIG. 10B. In this, however, the size (parallel number or W/L) of the NMOS current source 314 is different from each other. For example, assuming that the size of the NMOS current source 277 is 1, the size of each of the NMOS current sources 314 may be set to ½×1/T2 times in accordance with a frequency ratio T2 of the digital signal CK2 [n] (n=0 to 4) and the digital signal CK2 [4].

In each of the five such arrangements arranged in parallel, the path that carries the current generated by the NMOS current source 314 is selected. Accordingly, in the slope D/A converter B207, the current Itb2 generated by the NMOS current source 314 is divided into the current Ib2 and the current Ibu2 in accordance with the selection ratio. That is, the current Itb2 is divided into the current Ib2 and the current Ibu2 in accordance with the ratio between the number of the NMOS switches 311 in the on state and the number of the NMOS switches 312 in the on state.

<Digital Signal Waveform>

Figure 11:
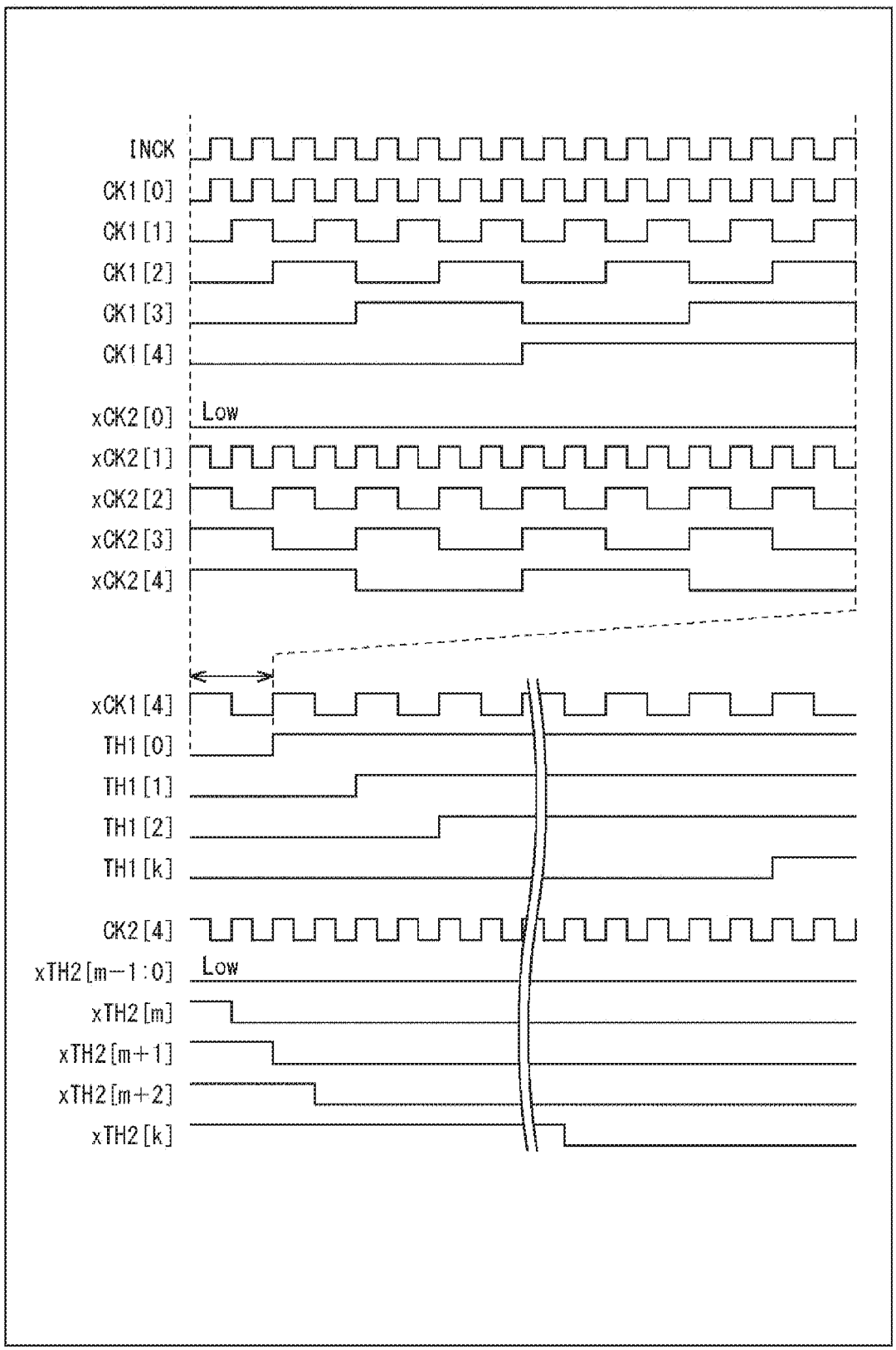
FIG. 11 is a diagram illustrating an example of a digital signal waveform.

FIG. 11 is a diagram illustrating an example of a digital signal waveform. The input clock INCK input to the frequency divider 211 is frequency-divided by ½ from the digital signal CK1 [0] by the frequency divider 211, so as to generate the digital signal CK1 [4:0]. Among them, the digital signal xCK1 [4] becomes a reference clock of the shift register 213. The value of the shift register 213 transitions at the edge of the digital signal xCK1 [4] from low to high. High is input to the first stage of the shift register 213, and the value sequentially transitions from the digital signal TH1 [0] to the digital signal TH1 [k] at the frequency of the digital signal CK1 [4] toward high.

The digital signal xCK2 [0] is controlled to be fixed to low. The input clock INCK input to the frequency divider 221 is frequency-divided by ½ from the digital signal xCK2 [1] by the frequency divider 221, so as to generate the digital signal xCK1 [4:0]. With the input stages mutually changed between the channel of the digital signal TH1 [k:0] and the channel of the digital signal TH2 [k:0], it is possible to more easily change the division ratio.

As described above, the digital signal CK2 [4] has a frequency twice as high as the digital signal CK1 [4]. The digital signal xTH2 [m−1:0] is fixed to low by initial setting operation by the reset set of the shift register, and the transition starts from the digital signal xTH2 [m]. In a case where the operating frequency of the digital signal xTH2 [k:0] is higher than the digital signal TH1 [k:0] as in the example of FIG. 11, the initial setting code of the shift register 223 can be set to the same as the initial setting code T of the shift register 213 or can be advanced to the next code.

<Shift Register>

Figure 12:
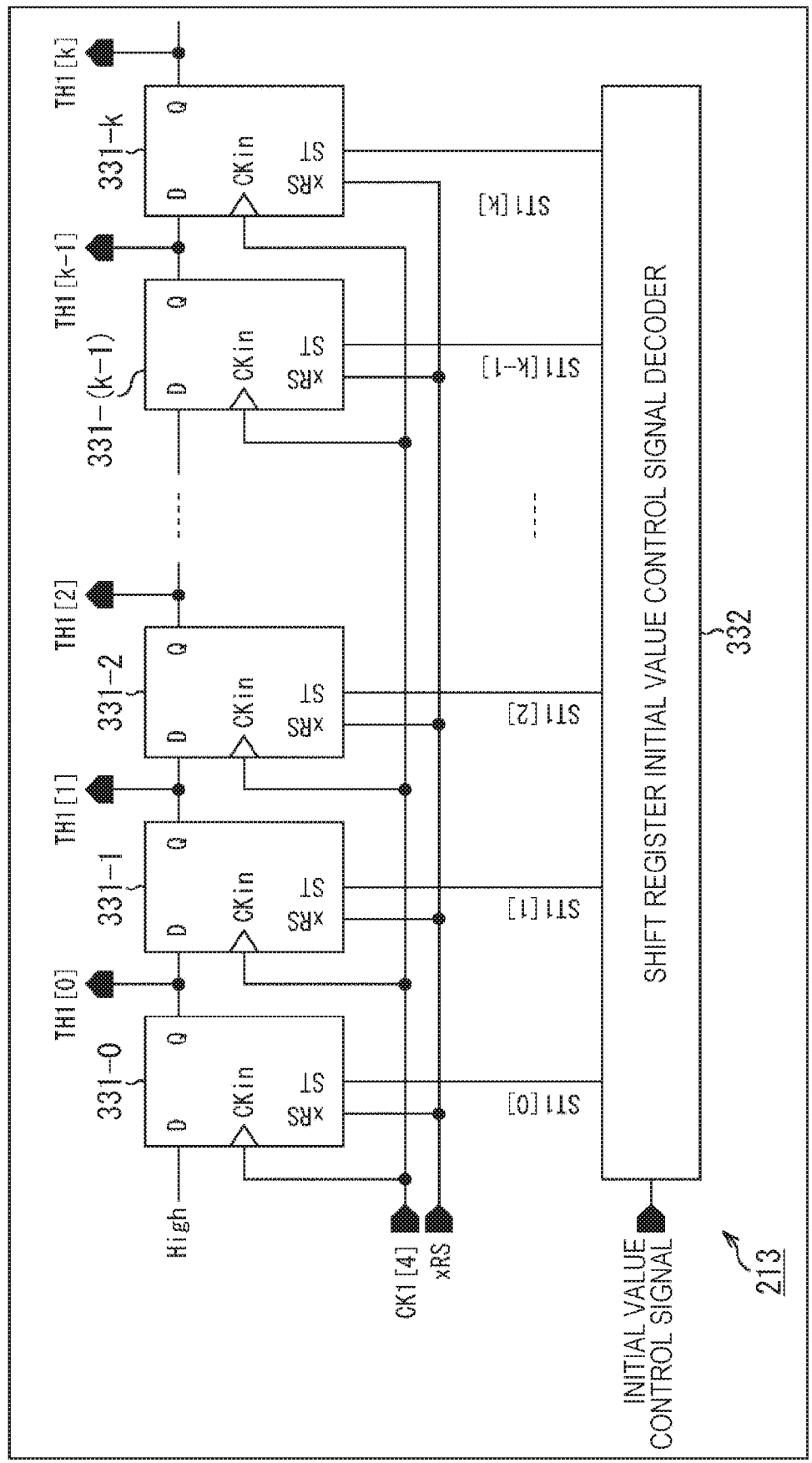
FIG. 12 is a diagram illustrating a main configuration example of a shift register.

FIG. 12 is a diagram illustrating a main configuration example of the shift register 213. The shift register 213 includes flip-flops 331-0 to 331-k, and a shift register initial value control signal decoder 332. Hereinafter, in a case where it is not necessary to distinguish the flip-flops 331-0 to 331-k from each other, they each will be referred to as the flip-flop(s) 331.

The (k+1) flip-flops 331 are connected in order. A high signal is input to a D terminal of the first flip-flop. When the control signal xRS is set to low, the data held in each of the flip-flops 331 is reset and the Q terminal is set to low. In proceeding with the initial setting of the shift register 213, the shift register initial value control signal decoder 332 sets the control signal ST [m−1:0] to high simultaneously or later than the timing of being reset by the control signal xRS, enabling the digital signal TH1 [m−1:0] to be set to high. When the clock operation of the digital signal CK1 [4] starts, the data transition of the shift register 213 is started from the digital signal TH [m]. The initial value control signal is decoded by the shift register initial value control signal decoder 332 into a thermometer code representing the value by the number of "1".

Figure 13:
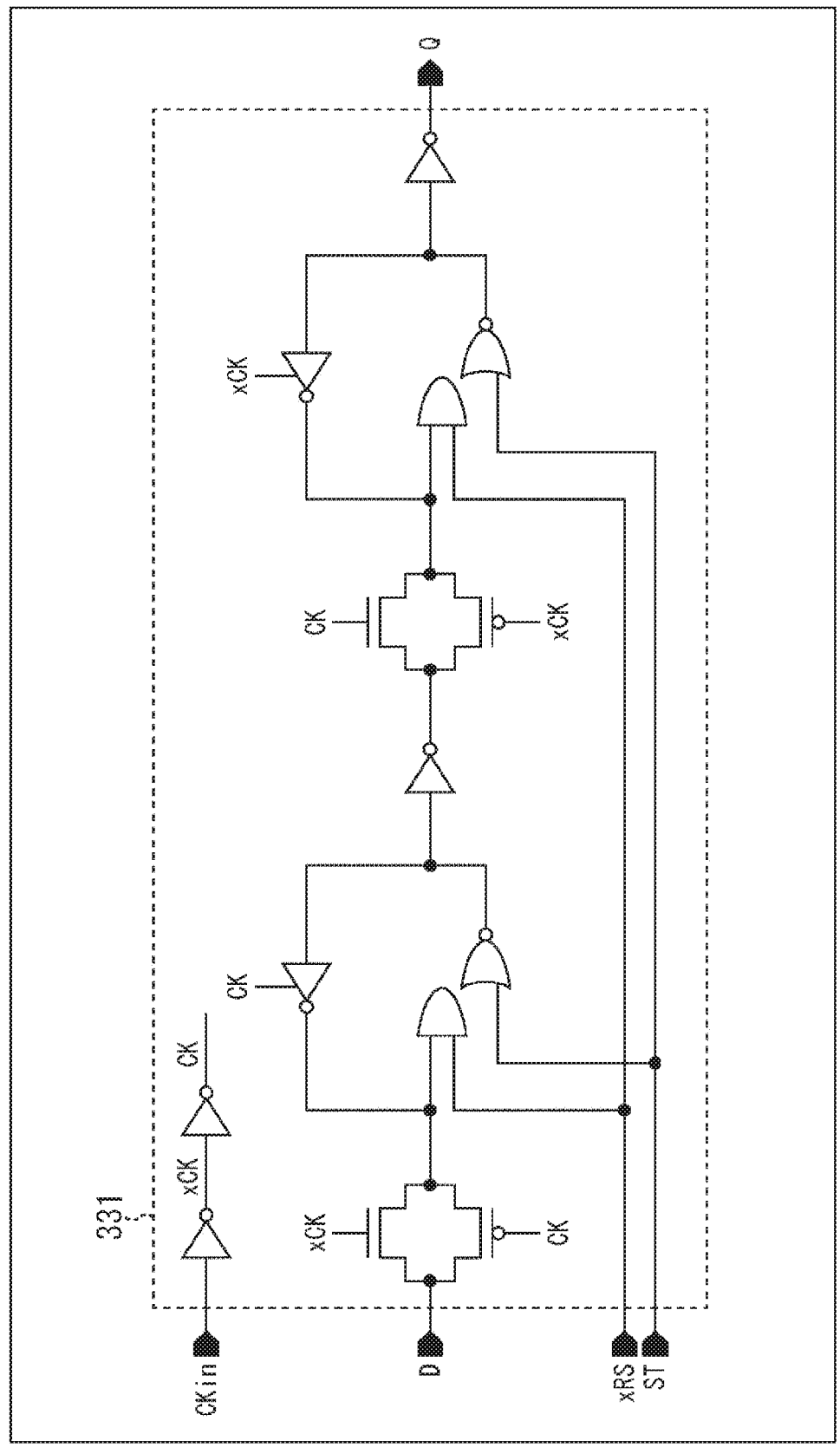
FIG. 13 is a diagram illustrating a main configuration example of a flip-flop.

Note that each of the flip-flops 331 has a configuration as illustrated in FIG. 13, for example. The configuration of the flip-flop 331, however, is arbitrary and is not limited to the example of FIG. 13.

The configuration and processing of the shift register 223 are similar to the case of the above-described shift register 213, and thus, the description of FIGS. 12 and 13 can also be applied to the shift register 223. Accordingly, description of the shift register 223 will be omitted.

<Example of Operation Waveform of Reference Signal Generation Unit>

Figure 14:
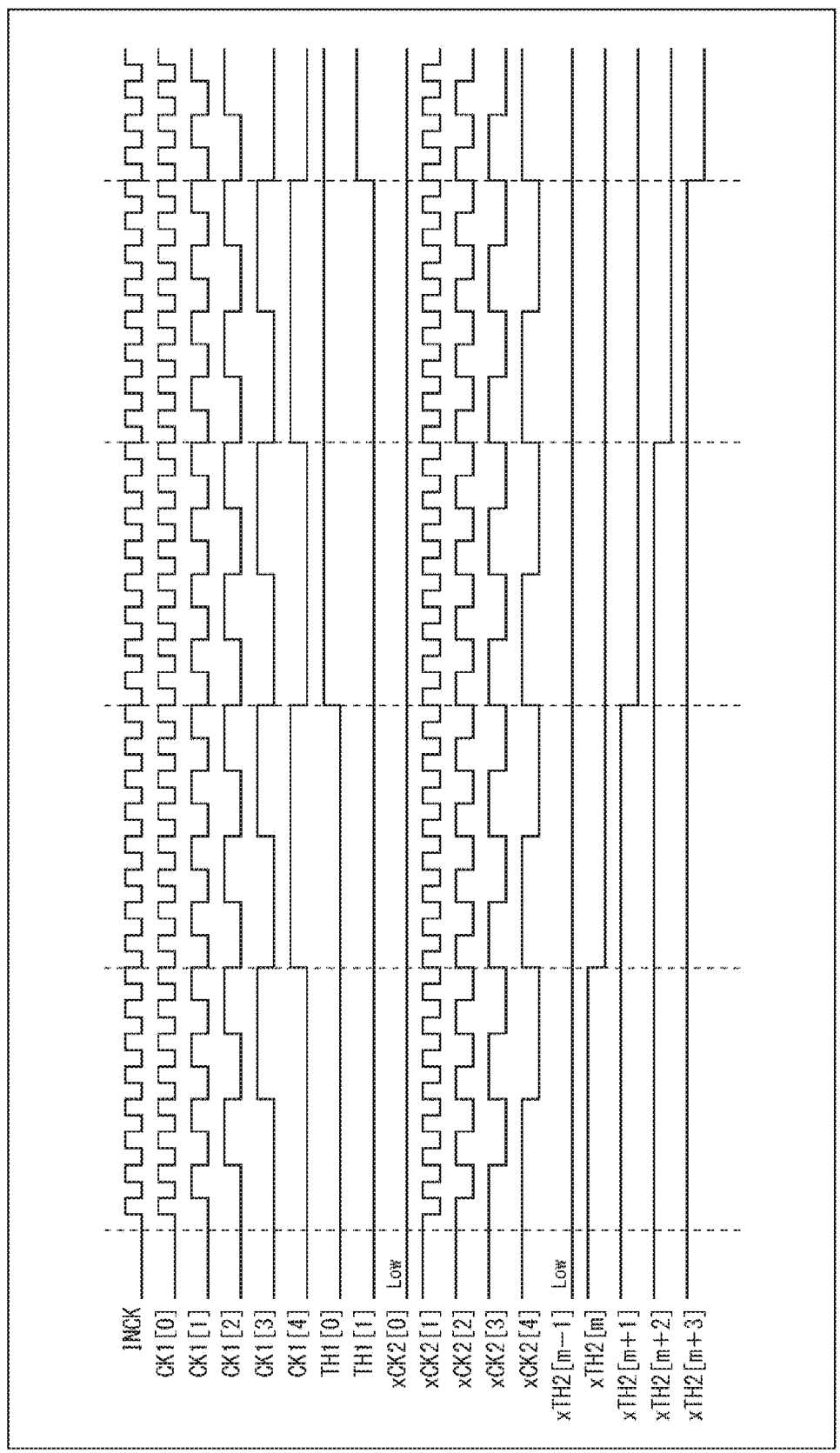
FIG. 14 is a diagram illustrating an example of a digital signal waveform.
Figure 15:
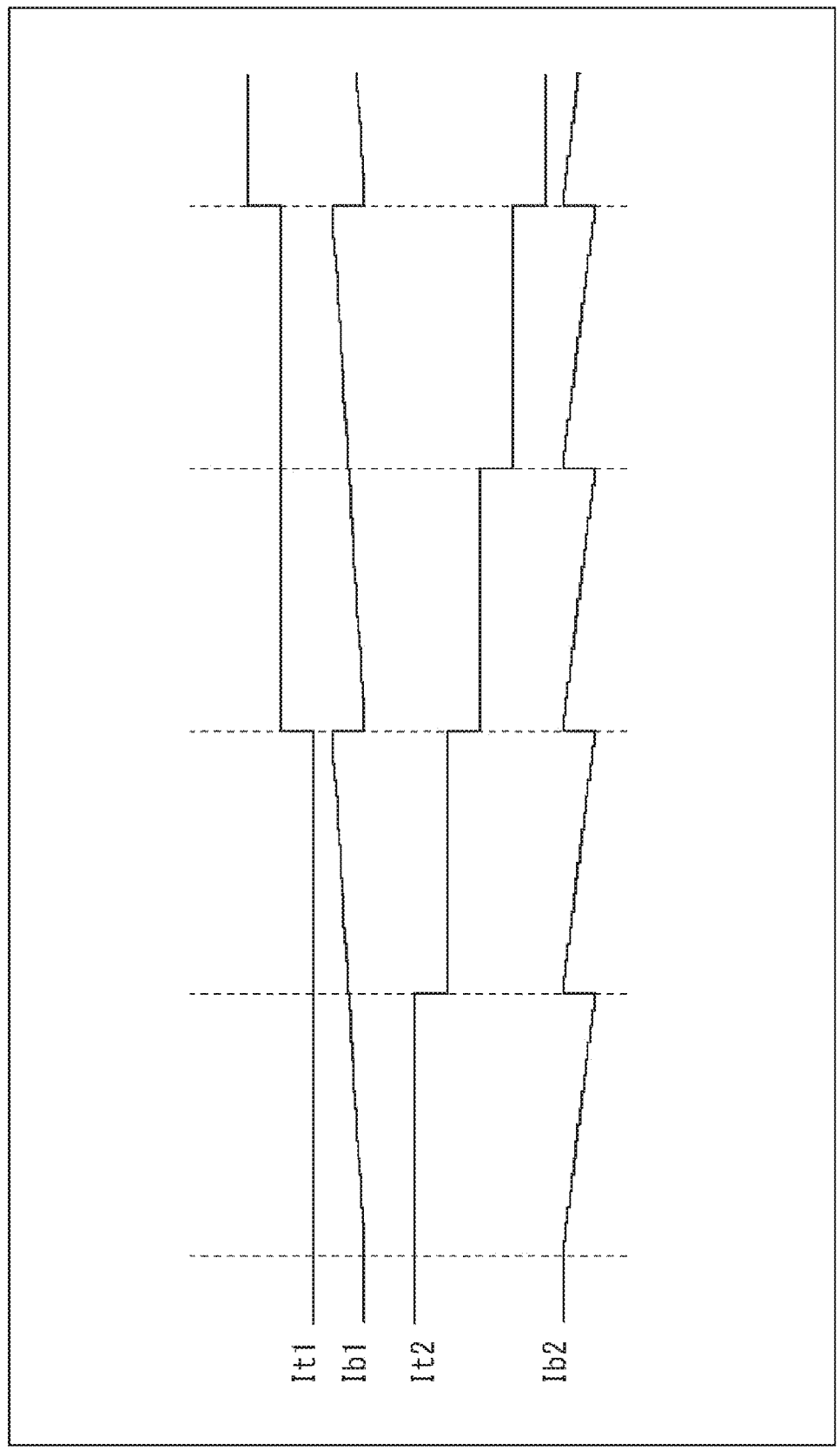
FIG. 15 is a diagram illustrating an example of an output current waveform.
Figure 16:
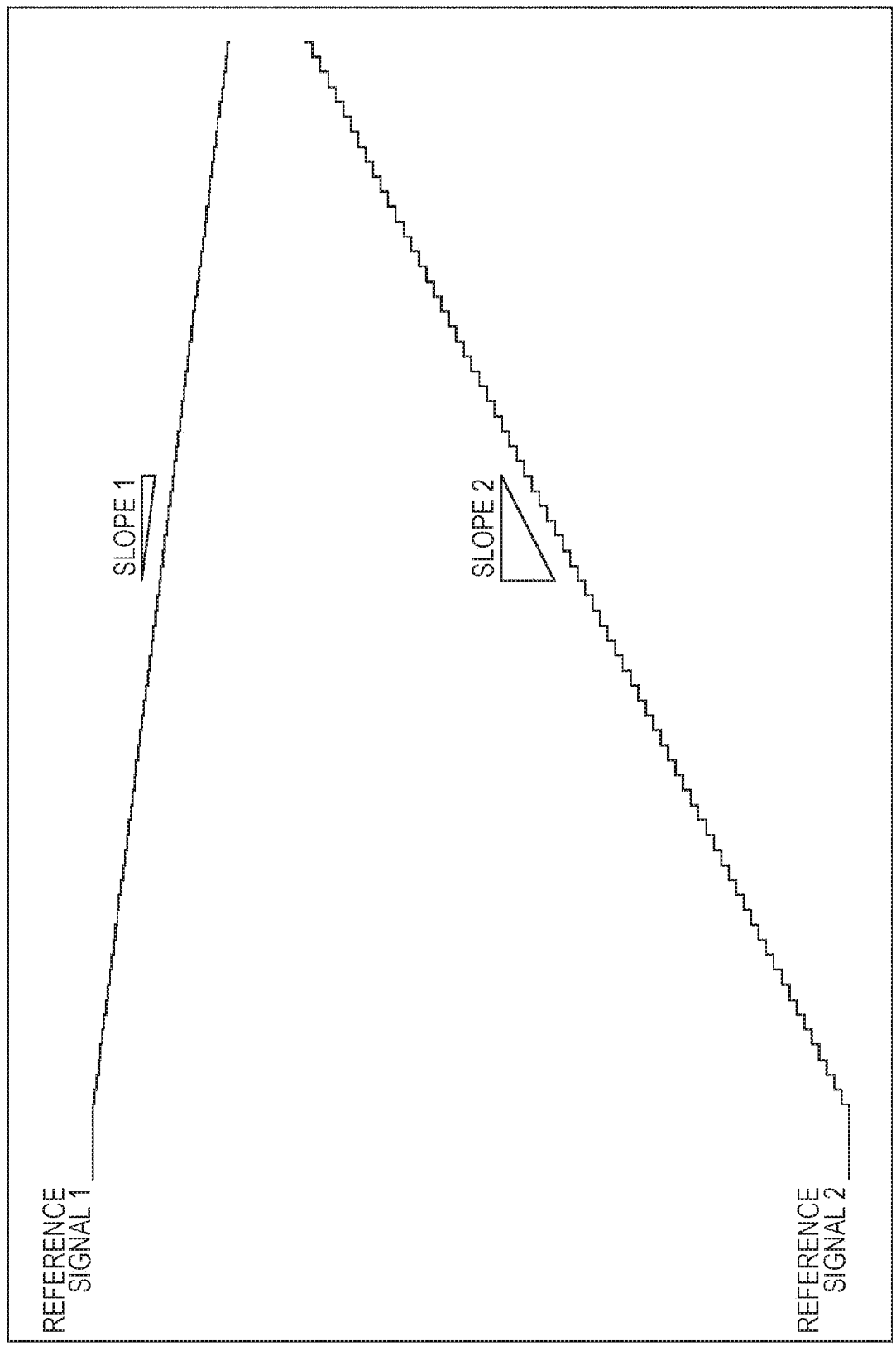
FIG. 16 is a diagram illustrating an example of a reference signal waveform.

FIGS. 14 to 16 illustrate examples of various signal waveforms related to the operation of the reference signal generation unit 163. The initial value code of the shift register 213 is set to 0, and the initial value code of the shift register 223 is set to (m−1). As illustrated in FIG. 14, the digital signal xCK2 [4] has a frequency twice as high as the digital signal CK1 [4]. Furthermore, the resistance value R2 of the resistor 209 is twice as large as the resistance value R1 of the resistor 208.

The reference signal generation unit 163 performs processing on the basis of various digital signals having waveforms as illustrated in FIG. 14, and generates output currents (current It1, current Ib1, current It2, current Ib2) of the waveforms as illustrated in FIG. 15. From these output currents, the reference signal 1 and the reference signal 2 having the waveforms as illustrated in FIG. 16 are generated and output from the reference signal generation unit 163. At this time, the relationship between gradient 1 of the reference signal 1 and gradient 2 of the reference signal 2 is expressed by [gradient of the reference signal 2]=[gradient of the reference signal 1]×(−4).

<Example of Transition of Current Value>

Figure 17:
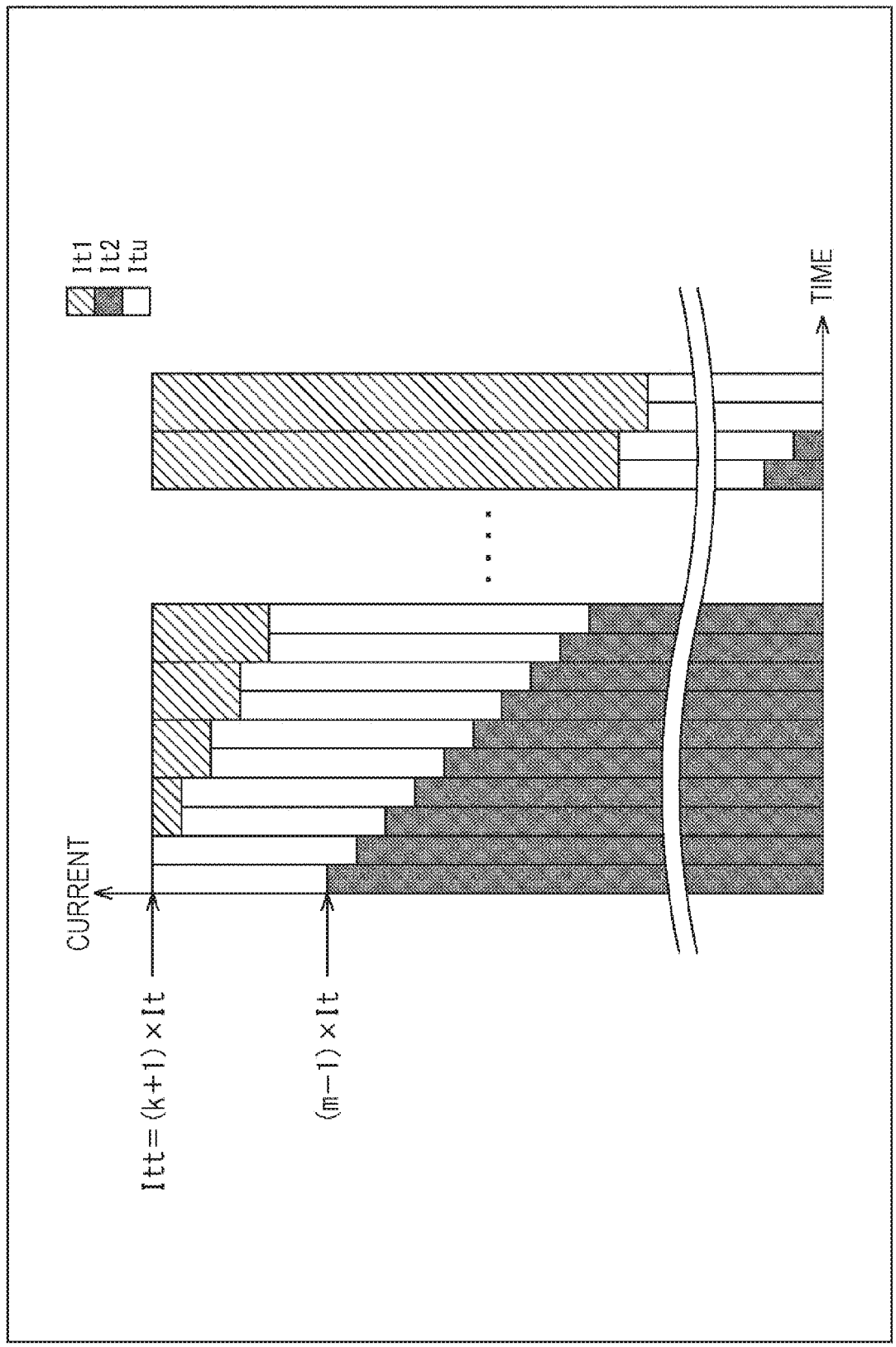
FIG. 17 is a diagram illustrating an example of transition of current division.

FIG. 17 illustrates transitions of current values of the current It1, the current It2, and the current Itu in the example of FIG. 15. Assuming that the current value per one NMOS current source 277 is It, the total current Itt of (k+1) configurations is calculated as Itt=(k+1)×It. The initial value of the current It2 is set to (m−1)×It. The current Itt is constant with respect to time, and expressed as Itt=It1+It2+Itu. That is, a predetermined current generated by receiving the gain control signal that controls the gain is divided into a plurality of output currents and a non-output current in accordance with the value of the input digital signal. Accordingly, it is possible to suppress an increase in circuit area and power consumption without necessity to provide a slope D/A converter for each of the gains.

Note that in the example of FIG. 17, the current It2 is reduced as the current It1 is increased in the time direction. In this manner, in the case of dividing the current into the output currents of two channels and the non-output current of one channel, the first output current may be increased in the time direction and the second output current may be reduced in the time direction. In this manner, with the directions of the change in the output currents opposite to each other, it is possible to further reduce the change of the sum of the current It1 and the current It2 in the time direction, leading to more effective utilization of the current Itt. Accordingly, there is no need to moderate the gradient of the slope of each of the current It1 and the current It2, or to shorten the period during which the reference signal is available, for example.

Of course, both the first output current and the second output current may be increased (or reduced) in the time direction. That is, the direction of change of each of the output currents may be set to the same direction.

Note that in a case where a digital signal TH1 [q] and a digital signal xTH2 [q] simultaneously become high in the example of FIG. 7, the NMOS switch (N1) is preferentially turned on with respect to the NMOS switch 272 (N2). Still, this is not practical in normal case because of occurrence of variation in the gradient of the slope of the reference signal 2. Therefore, it is allowable to use a restriction in operation so as not to permit the digital signal TH1 [q] and the digital signal xTH2 [q] input to the qth configuration of the slope D/A converter T205 to become high at the same time.

<Waveform of a Signal Related to A/D Conversion>

Figure 18:
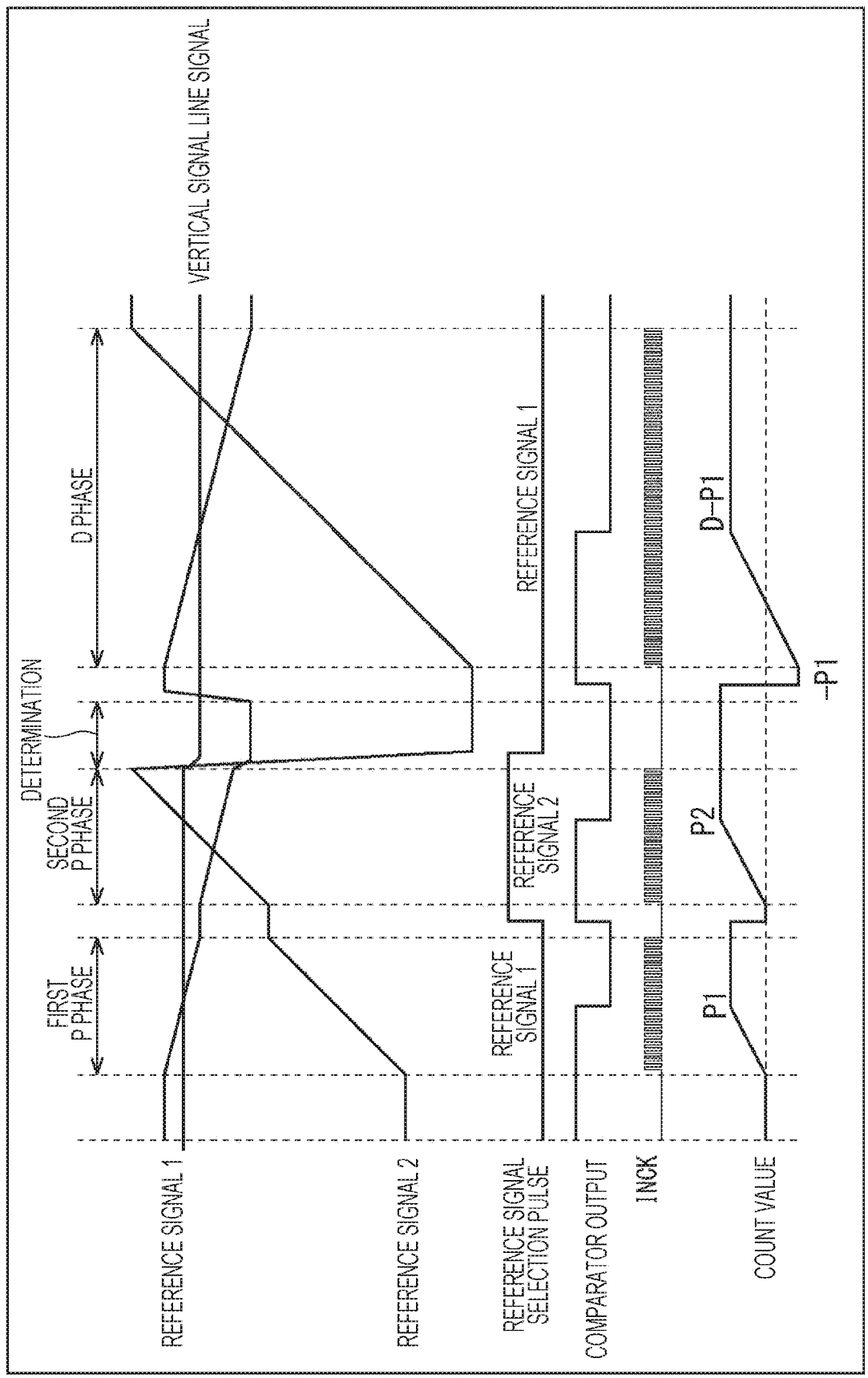
FIG. 18 is a diagram illustrating an example of a signal waveform related to A/D conversion in a dark situation.
Figure 19:
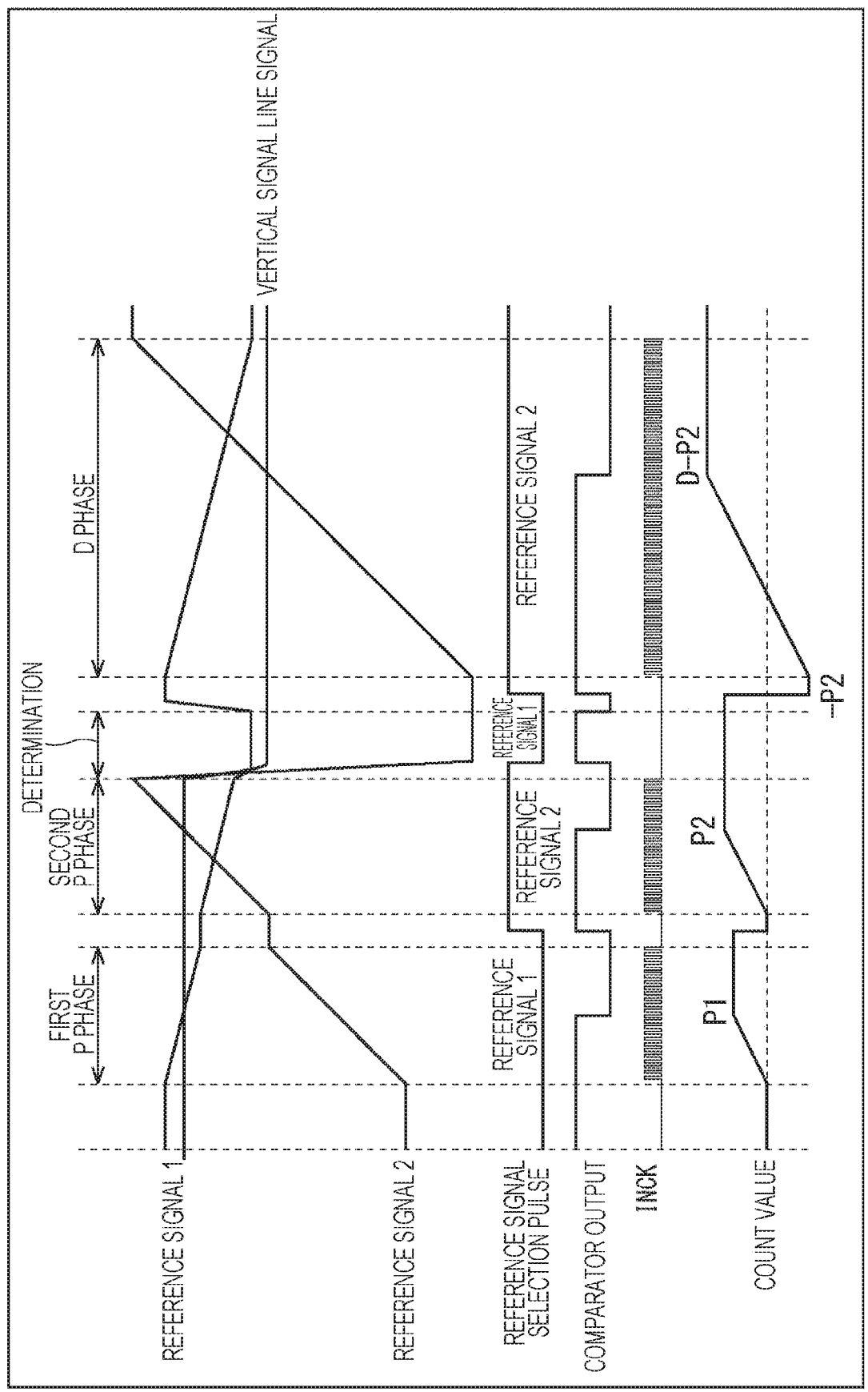
FIG. 19 is a diagram illustrating an example of a signal waveform related to A/D conversion in a bright situation.

FIGS. 18 and 19 illustrate examples of waveforms of various signals in the A/D conversion performed by the column A/D converter 162 using the reference signal 1 and the reference signal 2 generated by the reference signal generation unit 163 as described above.

FIG. 18 is a diagram illustrating a waveform example of adaptive gain A/D conversion in a case where the pixel signal is low (dark). The column A/D converter 162 performs adaptive gain A/D conversion that adaptively switches the reference signal to be used on the basis of the magnitude of the pixel signal to be A/D converted.

The reset level of the pixel is obtained with reference signal 1 (first P phase) and reference signal 2 (second P phase), individually. The vertical signal line signal after the pixel signal transfer is compared with a predetermined determination voltage generated by the set signal of the shift register of the reference signal 1, and in a case where the pixel signal is lower, the selector 174 obtains the phase D while being connected to the reference signal 1 as illustrated in FIG. 18. The counter 172 counts up to the timing from the start of the clock transition of INCK to the point of transition of the output of the comparator 171 from high to low. The determination value latch 173 obtains a count value P1 of the first P phase and holds the count value P1 in its own holding circuit. Thereafter, the determination value latch 173 resets the count value of the counter 172.

Moreover, the determination value latch 173 obtains a count value P2 of the second P phase. In response to the determination result, the determination value latch 173 reads the count value P1 from the holding circuit and restores it, then performs bit inversion and sets—P1 as an initial value of the counter 172. Thereafter, the determination value latch 173 causes the selector 174 to select the reference signal 1. The counter 172 can obtain the data of the digital CDS D−P1 by counting the D phase.

FIG. 19 is a diagram illustrating a waveform example of adaptive gain A/D conversion in a case where the pixel signal is high (bright). Since the pixel signal is lower than the determination voltage in the determination operation, the determination value latch 173 performs bit inversion and sets—P2 as the initial value of the counter 172. Thereafter, the determination value latch 173 causes the selector 174 to select the reference signal 2. The counter 172 can obtain the data of the digital CDS D−P2 by counting the D phase.

As described above, the column A/D converter 162 can perform adaptive gain A/D conversion using the plurality of reference signals (reference signal 1 and reference signal 2) generated by the reference signal generation unit 163. That is, the column A/D converter 162 can implement A/D conversion with high speed, high dynamic range, and higher accuracy.

2. Second Embodiment

<Multi-Slope A/D Conversion>

While the adaptive gain A/D conversion has been described above, the present technology can also be applied to A/D conversion of other methods. For example, the present technology can also be applied to an A/D converter that performs multi-slope A/D conversion.

<Column Parallel Processing Unit>

Figure 20:
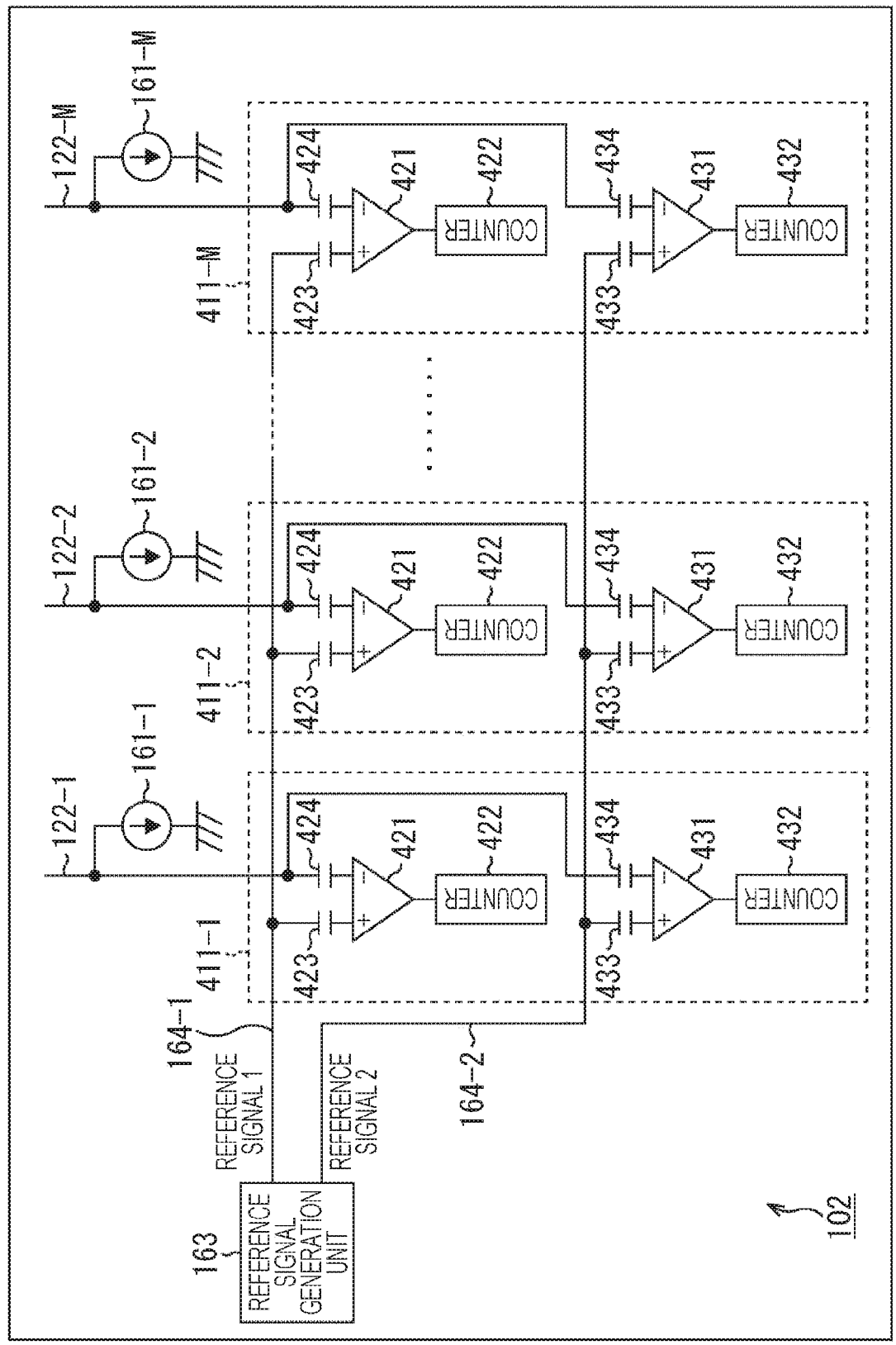
FIG. 20 is a diagram illustrating another configuration example of a column parallel processing unit.

FIG. 20 is a diagram illustrating another configuration example of the column parallel processing unit 102 according to present technology. As illustrated in FIG. 20, the column parallel processing unit 102 in this case uses a column A/D converter 411-1 to column A/D converter 411-M respectively instead of the column A/D converter 162-1 to the column A/D converter 162-M. Note that, hereinafter, in a case where it is unnecessary to distinguish and describe the column A/D converter 411-1 to the column A/D converter 411-M from each other, they each will be referred to as the column A/D converter(s) 411.

The column A/D converter 411 performs multi-slope A/D conversion that first performs A/D conversion on the analog signal as an A/D conversion target using each of a plurality of reference signals, and then selects any of A/D conversion results on the basis of the A/D conversion result (digital data).

As illustrated in FIG. 20, the column A/D converter 411 includes a comparator 421, a counter 422, a capacitor 423, a capacitor 424, a comparator 431, a counter 432, a capacitor 433, and a capacitor 434.

The comparator 421 to the capacitor 424 are configurations for the reference signal 1. One input terminal of the comparator 421 is connected to the reference signal line 164-1 via the capacitor 423. Furthermore, the other input terminal of the comparator 421 is connected to the vertical signal line 122 via the capacitor 424. Furthermore, the output terminal of the comparator 421 is connected to the counter 422.

The reference signal 1 is input to one input terminal of a comparator 421 connected to the capacitor 423, via the capacitor 423. Furthermore, an analog signal (for example, a pixel signal, or the like) read from the unit pixel 121 of the pixel array 101 is input to the other input terminal of the comparator 421 to which the capacitor 424 is connected. The comparator 421 compares the magnitudes of these signals and supplies information indicating which of the signals has a higher signal level to the counter 422 as a comparison result.

The input terminal of the counter 422 is connected to the output terminal of the comparator 421, and receives a supply of a comparison result from the comparator 421. The counter 422 measures (for example, counts the number of clocks of the predetermined clock signal) the time from the start of counting until the comparison result is inverted (signal level of the output signal from the comparator 421 changes).

The capacitor 423 and the capacitor 424 are capacitive elements for analog CDS that cancels element variation being analog.

The comparator 431 to the capacitor 434 are configurations for the reference signal 2. One input terminal of the comparator 431 is connected to the reference signal line 164-2 via the capacitor 433. Furthermore, the other input terminal of the comparator 431 is connected to the vertical signal line 122 via the capacitor 434. Furthermore, the output terminal of the comparator 431 is connected to the counter 432.

The reference signal 2 is input to one input terminal of a comparator 431 connected to the capacitor 433, via the capacitor 433. Furthermore, an analog signal (for example, a pixel signal, or the like) read from the unit pixel 121 of the pixel array 101 is input to the other input terminal of the comparator 431 to which the capacitor 434 is connected. The comparator 431 compares the magnitudes of these signals and supplies information indicating which of the signals has a higher signal level to the counter 432 as a comparison result.

The input terminal of the counter 432 is connected to the output terminal of the comparator 431, and receives a supply of a comparison result from the comparator 431. The counter 432 measures (for example, counts the number of clocks of the predetermined clock signal) the time from the start of counting until the comparison result is inverted (signal level of the output signal from the comparator 431 changes).

The capacitor 433 and the capacitor 434 are capacitive elements for an analog CDS that cancels element variation being analog.

As described above, a plurality of reference signals (analog signals) is used by mutually different A/D converters in the case of multi-slope A/D conversion.

Figure 21:
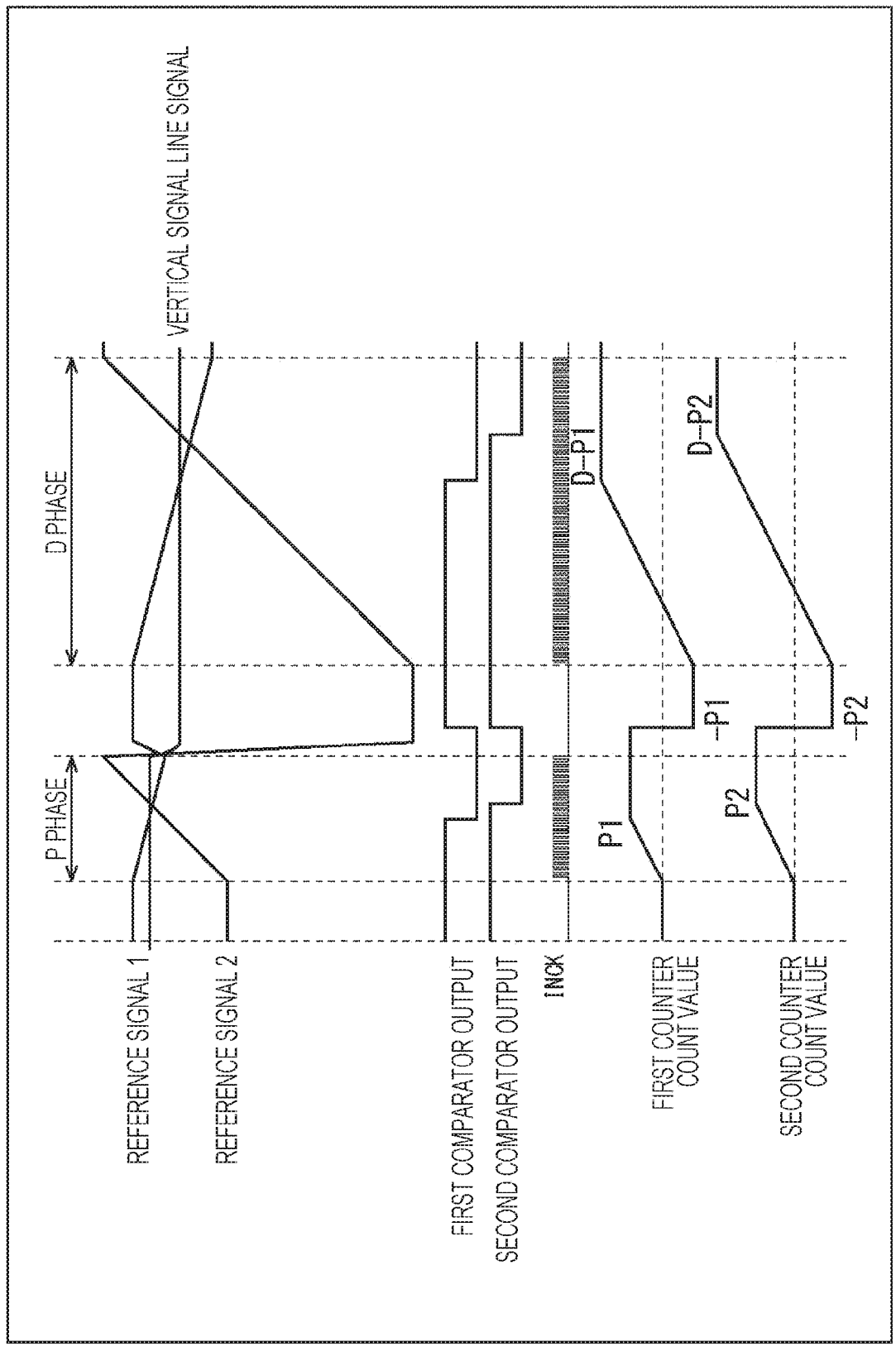
FIG. 21 is a diagram illustrating an example of a signal waveform related to A/D conversion.

FIG. 21 is a diagram illustrating an example of operation waveforms in the case of the multi-slope A/D conversion. Unlike the case of the adaptive gain A/D conversion described above, parallel A/D conversion is possible in the case of multi-slope A/D conversion, and thus, it is sufficient to perform P phase and D phase once for each. The gradient of the reference signal 1 is gentle and the voltage range is small, leading to acquisition of a count value (D−P1) by the comparator 421 and the counter 422. The gradient of the reference signal 2 is steep and the voltage range is wide, leading to acquisition of a count value (D−P2) by the comparator 431 and the counter 432. The reference signal 1 and the reference signal 2 have different signs of gradient, and thus, the counter 432 performs positive/negative inversion on the count value (D−P2) and adds an offset value Y to the inversion result to be (P2−D+Y).

Y is determined such that P2−D+Y=0 is established when a pixel signal in a completely shielded state is obtained. By selecting (D−P1) when P2−D+Y is smaller than the predetermined code and selecting (P2−D+Y) when P2−D+Y is larger than the predetermined code, it is possible to enhance the A/D resolution in a dark place without sacrificing the dynamic range or the frame rate. Furthermore, the mode of performing A/D conversion to enable the gradient ratio of the reference signal 1 and the reference signal 2 to be −1 has an effect of improving random noise due to multiple A/D conversion. Random noise of a pixel is improved by $1/\sqrt{2}$ times in voltage conversion by taking averaging by calculation of ((D−P1)+(D−P2+Y))/2.

In this manner, the present technology can also be applied to multi-slope A/D conversion. With application of the present technology, it is possible to obtain an effect similar to the case of adaptive gain A/D conversion.

3. Third Embodiment

<Number of Channels of Output Analog Signal>

Note that while the above description is a case where analog signals (reference signals) of two channels are generated, the present technology can also be applied to the case of generating analog signals of three or more channels. In other words, present technology can be applied to the case of generating a plurality of channels of analog signals.

<Reference Signal Generation Unit>

Figure 22:
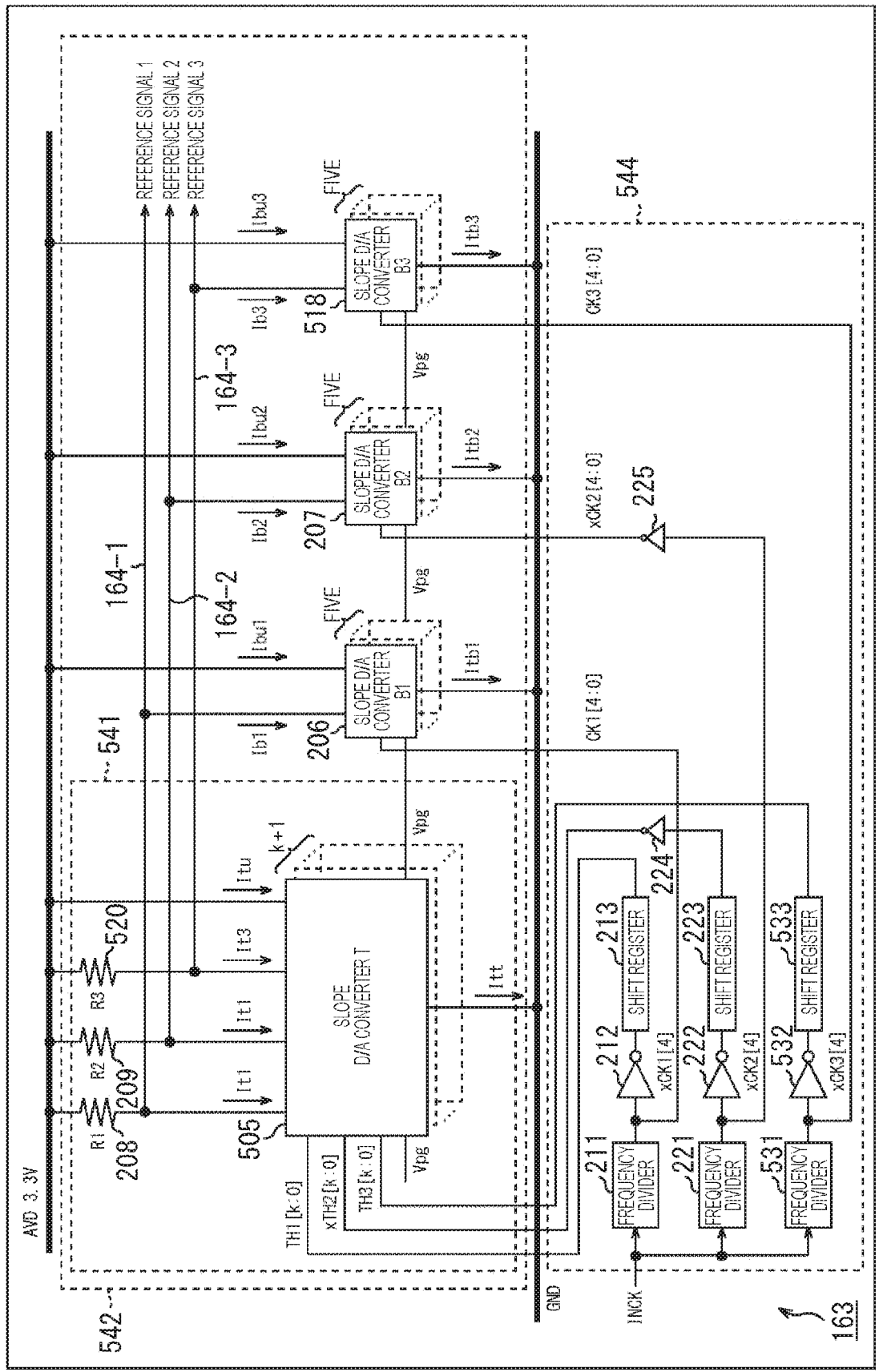
FIG. 22 is a diagram illustrating another configuration example of the reference signal generation unit.

FIG. 22 is a diagram illustrating another configuration example of the reference signal generation unit 163 according to the present technology. In this case, the reference signal generation unit 163 outputs reference signals of three channels (reference signals 1 to 3). The reference signal 1 is output from the reference signal line 164-1. The reference signal 2 is output from the reference signal line 164-2. The reference signal 3 is output from the reference signal line 164-3.

Note that the gain control unit 233 has a configuration similar to the case of FIG. 4, and thus, the illustration thereof is omitted in FIG. 22. In this case, the reference signal generation unit 163 includes a slope D/A converter T505 instead of the slope D/A converter T205. Furthermore, the reference signal generation unit 163 in this case further includes a slope D/A converter B518 in addition to the slope D/A converter B206 and the slope D/A converter B207. Moreover, the reference signal generation unit 163 in this case further includes a resistor 520 having a resistance value R3 in addition to the resistor 208 and the resistor 209.

Furthermore, the reference signal generation unit 163 in this case includes a frequency divider 531, a NOT gate 532, and a shift register 533 in addition to the frequency divider 211, the shift register 213, and the frequency divider 221 to the NOT gate 225.

That is, in the reference signal generation unit 163 in this case, there are three channels (three lines) of analog signal output channels (reference signal line 164), and thus, individual processing units have corresponding configurations.

The slope D/A converter 505 generates the current Itt according to the bias voltage Vpg and divides the current Itt into the current It1, the current It2, the current It3, and the current Itu in a ratio according to the values of the digital signal TH1 [k:0], the digital signal xTH2 [k:0], and the digital signal TH3 [k:0]. The slope D/A converter T505 includes (k+1) parallel configurations to generate the current Itt according to the bias voltage Vpg and to assign the current Itt to any of the current It1, the current It2, the current It3, and the current Itu. k is an arbitrary natural number. That is, the number of this configuration is arbitrary. With individual assignment of the current Itt by this (k+1) configuration in accordance with the value corresponding to the own configuration among the digital signal TH1 [k:0], the digital signal xTH2 [k:0], and the digital signal TH3 [k:0], the current Itt according to the bias voltage Vpg as a whole is divided into the current It1, the current It2, the current It3, and the current Itu in a ratio according to the values of the digital signal TH1 [k:0], the digital signal xTH2 [k:0], and the digital signal TH3 [k:0]. In other words, Itt=It1+It2+It3+Itu is established regardless of the values of the digital signal TH1 [k:0], the digital signal xTH2 [k:0], and the digital signal TH3 [k:0].

A resistor 520 having a resistance value R3 and a reference signal line 164-3 are connected to the signal line that carries the current It3. The current It3 is converted into a voltage by the resistor 520, and output as an analog signal (reference signal 3) from the reference signal line 164-3.

That is, the current It1, the current It2, and the current It3 are the output currents to be output, and the current Itu is the non-output current (also referred to as a discard current) that is not to be output. That is, the slope D/A converter T505 generates a predetermined current Itt according to the bias voltage Vpg and divides the current Itt into output currents of three channels (current It1, current It2, and current It3) and the non-output current (current Itu) at a ratio according to the values of the digital signal TH1 [k:0], the digital signal xTH2 [k:0], and the digital signal TH3 [k:0]. Thereafter, the output currents of the three channels are converted into voltages, and are output as analog signals of three channels (reference signal 1, reference signal 2, and reference signal 3).

The slope D/A converter B518 (slope D/A converter B3) is a binary code current source for the reference signal 3. The slope D/A converter B518 generates a current Itb3 corresponding to the bias voltage Vpg, and divides the current Itb3 into a current Ib3 and a current Ibu3 in a ratio according to the value of the digital signal CK3 [4:0]. The slope D/A converter B518 controls a lower bit of the signal level of the reference signal 3 by the current Ib3, for example. The slope D/A converter B518 includes five configurations arranged in parallel so as to generate a current the Itb3 according to the bias voltage Vpg and assign the current Itb3 to the current Ib3 or the current Ibu3. With individual assignment of the current Itb3 by the five configurations in accordance with the value corresponding to the own configuration among the digital signals CK3 [4:0], the current Itb3 according to the bias voltage Vpg as a whole is divided into the current Ib3 and the current Ibu3 in a ratio according to the values of the digital signals CK3 [4:0]. In other words, Itb3=Ib3+Ibu3 is established regardless of the value of the digital signal CK3 [4:0]. In this case, the slope D/A converter B518 controls the lower five bits of the signal level of the reference signal 3, for example.

The current Ib3 is converted into a voltage by the resistor 520, and is output from the reference signal line 164-3 as an analog signal (reference signal 3). The voltage of the reference signal 3 is calculated as AVD−(It3+Ib3)×R3. Note that the signal line that carries the current Ibu3 is connected to the power supply potential AVD (for example, 3.3V).

That is, the current Ib3 is an output current to be output, and the current Ibu3 is a non-output current (also referred to as a discard current) that is not output. That is, the slope D/A converter B518 generates the predetermined current Itb3 according to the bias voltage Vpg, and divides the current Itb3 into a single output current (current Ib3) and a non-output current (current Ibu3) in a ratio according to the value of the digital signal CK3 [4:0]. Then, this single output current (current Ib3) is converted into voltage and is output as an analog signal (reference signal 3). That is, the slope D/A converter B518 uses this single output current (current Ib3) to control the signal level of the analog signal (reference signal 3) output from the slope D/A converter T505.

Note that the parallel number of slope D/A converter B518 is arbitrary, and may be other than five. Furthermore, since the configuration of the slope D/A converter B518 is similar to that of the slope D/A converter B206 and the slope D/A converter B207, its description will be omitted.

The resistor 520 is a resistor of a resistance value R3, connected to the power supply potential AVD on one end, and connected to the signal line that carries the current It3 and the reference signal line 164-3 that carries the reference signal 3 on the other end. That is, the resistor 520 converts the current It3 and the current Ib3 into voltage. The resistance value R3 of the resistor 520 may be different from the resistance value R1 of the resistor 208 and the resistance value R2 of the resistor 209.

The frequency divider 531 divides the frequency of the input clock INCK to generate the digital signal CK3 [4:0]. With setting the frequency division ratio of the frequency divider 531 to a value different from the division ratio of the frequency divider 211 or the frequency divider 221, the digital signal CK3 [4] can have frequency different from the digital signal CK1 [4] or the digital signal CK2 [4]. The NOT gate 532 inverts the digital signal CK3 [4] among them, and generates a digital signal xCK3 [4]. The shift register 533 generates the digital signal TH3 [k:0] using the digital signal xCK3 [4]. The shift register 533 supplies the digital signal TH3 [k:0] to the slope D/A converter T505. Furthermore, the frequency divider 531 supplies the generated digital signal CK3 [4:0] to the slope D/A converter B518 (slope D/A converter B3).

In this case as well, similarly to the example of FIG. 11, the digital signal xCK2 [4] is set to have a frequency twice that of the digital signal xCK1 [4]. However, the transition of the digital signal xCK2 [4] is fast, and thus, the digital signal xCK3 [4] needs to be set to the frequency same as or slower than the frequency of the digital signal xCK1 [4]. Here, the digital signal xCK3 [4] is set to have a frequency that is ½ the digital signal xCK1 [4].

Note that as illustrated by the dotted line in FIG. 22, the resistor 208, the resistor 209, and the resistor 520 may be added to the slope D/A converter T505 to form a slope D/A converter T541. The slope D/A converter T541 may perform D/A conversion on the digital signal TH1 [k:0], the digital signal xTH2 [k:0], and the digital signal TH3 [k:0] to output the reference signal 1 to the reference signal 3 as analog signals. Furthermore, as illustrated by a dotted line in FIG. 22, the slope D/A converter B206, the slope D/A converter B207, and the slope D/A converter B518 may be added to the configuration of the slope D/A converter T541 to form a slope D/A converter 542. The slope D/A converter 542 can perform D/A conversion on the digital signal TH1 [k:0], the digital signal xTH2 [k:0], the digital signal TH3 [k:0], the digital signal CK1 [4:0], the digital signal xCK2 [4:0], and the digital signal CK3 [4:0] and can output the reference signal 1 to the reference signal 3 including lower bits as analog signals.

Note that, as illustrated by a dotted line in FIG. 22, the frequency divider 211, the NOT gate 212, the shift register 213, the frequency divider 221, the NOT gate 222, the shift register 223, the NOT gate 224, the NOT gate 225, the frequency divider 531, the NOT gate 532, and the shift register 533 may be collectively defined as a digital signal generation unit 544. The digital signal generation unit 544 uses the input clock INCK and generates the digital signal TH1 [k:0], the digital signal xTH2 [k:0], the digital signal TH3 [k:0], the digital signal CK1 [4:0], the digital signal xCK2 [4:0], and the digital signal CK3 [4:0], and then, supplies the generated signals to the slope D/A converter 542.

<Slope D/A Converter T>

Figure 23:
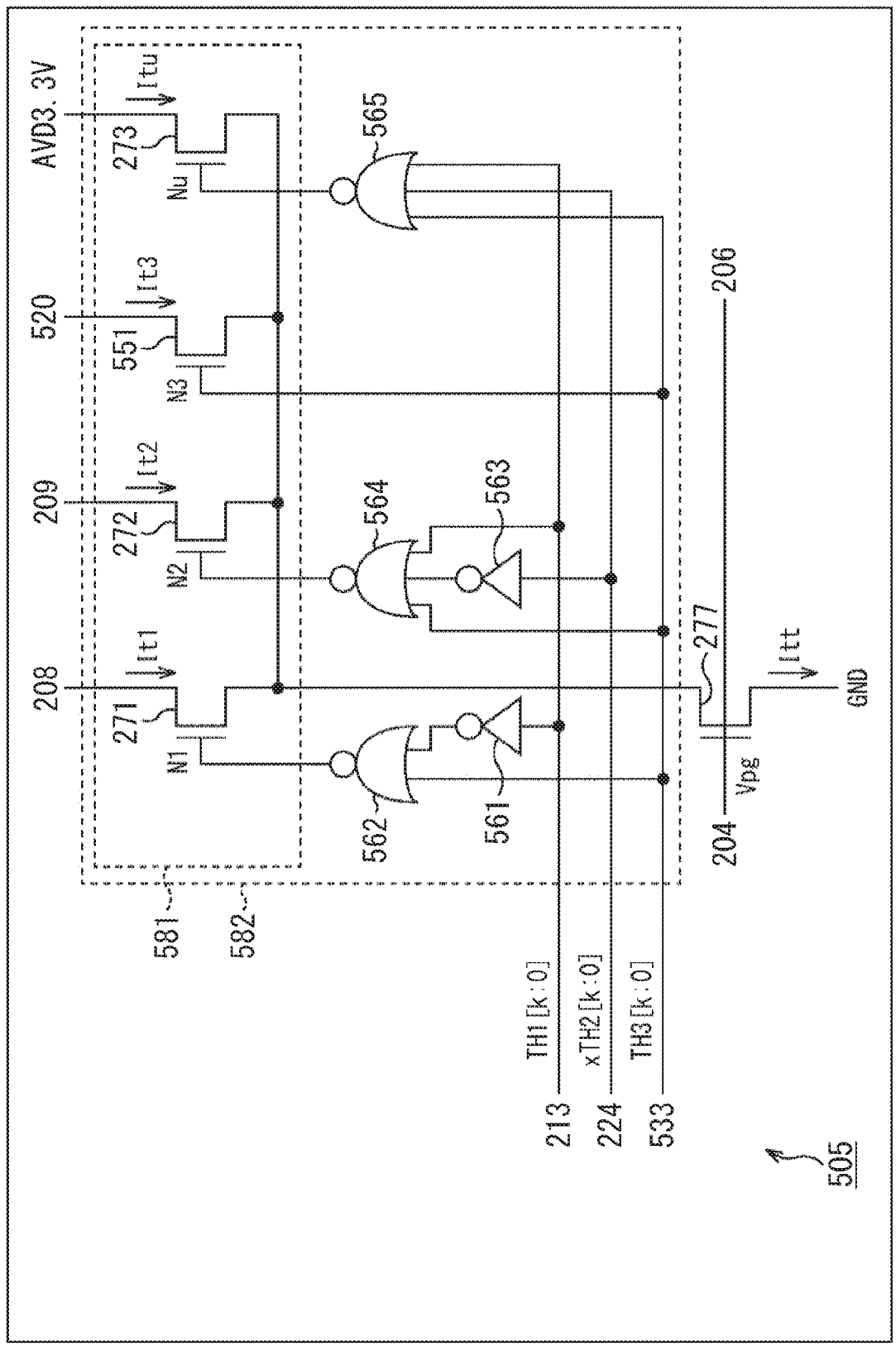
FIG. 23 is a diagram illustrating another configuration example of the slope D/A converter T.

FIG. 23 is a diagram illustrating a main configuration example of the slope D/A converter T505. FIG. 23 illustrates simply one of the (k+1) configurations arranged in parallel in the slope D/A converter T505. The other k configurations are similar to the configuration illustrated in FIG. 23, and thus their description will be omitted.

As illustrated in FIG. 23, the slope D/A converter T505 further includes a NMOS switch 551 in addition to the NMOS switch 271, the NMOS switch 272, and the NMOS switch 273. The slope D/A converter T505 further includes a NOT gate 561, a NOR gate 562, a NOT gate 563, a NOR gate 564, a NOR gate 565, and the NMOS current source 277 (NMOS current source T).

The NMOS switch 271 to the NMOS switch 273 and the NMOS switch 551 control the path of the current Itt. The NMOS switch 551 controls the connection between the NMOS current source 277 and the resistor 520. That is, the NMOS switch 551 controls whether or not the current Itt is to be the current It3.

Control is performed such that any one of the NMOS switch 271 to the NMOS switch 273 and the NMOS switch 551 is turned on by the digital signal TH1 [k:0], the digital signal xTH2 [k:0], and the digital signal TH3 [k:0].

The digital signal TH1 [k:0] supplied from the shift register 213 is supplied to the NOT gate 561, the NOR gate 564, and the NOR gate 565. Furthermore, the digital signal xTH2 [k:0] supplied from the NOT gate 224 is supplied to the NOT gate 563 and the NOR gate 565. Moreover, the digital signal TH3 [k:0] supplied from the shift register 533 is supplied to the NOR gate 562, the NOR gate 564, a gate of the NMOS switch 551, and the NOR gate 565.

For example, in a case where the digital signal TH3 [k:0] is "1", the NMOS switch 551 is turned on, while the NMOS switch 271, the NMOS switch 272, and the NMOS switch 273 are turned off. Furthermore, for example, in a case where the digital signal TH3 [k:0] is "0", the NMOS switch 551 is turned off. At this time, when the digital signal xTH2 [k:0] is "1", the NMOS switch 272 is turned on, while the NMOS switch 271 and the NMOS switch 273 are turned off. Conversely, when the digital signal xTH2 [k:0] is "0", the NMOS switch 272 is turned off, while the NMOS switch 271 and the NMOS switch 273 are turned on. At this time, when the digital signal TH1 [k:0] is "1", the NMOS switch 271 is turned on and the NMOS switch 273 is turned off. Conversely, when the digital signal TH1 [k:0] is "0", the NMOS switch 271 is turned off and the NMOS switch 273 is turned on.

With this configuration, the current Itt is set to one of the current It1, the current It2, the current It3, and the current Itu. That is, the NMOS switch 271 to the NMOS switch 273 and the NMOS switch 551 select which of the current It1, the current It2, the current It3, and the current Itu is set as the current Itt.

Note that as illustrated by the dotted line in FIG. 23, the NMOS switch 271 to the NMOS switch 273 and the NMOS switch 551 may be collectively defined as a switch 581. That is, the switch 581 includes the switches that are driven with the digital signal TH1 [k:0], the digital signal xTH2 [k:0], and the digital signal TH3 [k:0] as control signals and that controls connection between the signal line connected to each of the plurality of output signal lines (reference signal lines 164-1 to the reference signal line 164-3) that output analog signals, the signal line connected to the voltage source (power supply potential AVD), with the current source (NMOS current source 277). The configuration of the switch 581 can take any form as long as it is possible to select which of the current It1, the current It2, the current It3, and the current Itu, is to be set as the current Itt, and the configuration is not limited to the example described above.

Furthermore, as illustrated by the dotted line in FIG. 23, the NOT gate 561, the NOR gate 562, the NOT gate 563, the NOR gate 564, and the NOR gate 565 may be further added to the configuration of the switch 581 so as to be a D/A converter 582. The D/A converter 582 can output the current It1, the current It2, and the current It3 according to the digital signal TH1 [k:0], the digital signal xTH2 [k:0], and the digital signal TH3 [k:0].

As described above, the slope D/A converter T505 includes (k+1) configurations as illustrated in FIG. 23, arranged in parallel. The NMOS current sources 277 of the individual configurations are the same size (width W, length L, parallel number, or the like) with each other, and they individually carry equal currents. In each of such (k+1) configurations arranged in parallel, the path that carries the current generated by the NMOS current source 277 is selected. Accordingly, in the slope D/A converter T505 as a whole, the current Itt generated by the NMOS current source 277 is divided into the current It1, the current It2, the current It3, and the current Itu in accordance with the selection ratio. That is, the current Itt is divided into the current It1, the current It2, the current It3, and the current Itu in accordance with the ratio of the number of switches 581 connecting the NMOS current source 277 to the signal line carrying the current It1, the number of the switches 581 connecting the NMOS current source 277 to the signal line carrying the current It2, the number of the switches 581 connecting the NMOS current source 277 to the signal line carrying the current It3, and the number of the switches 581 connecting the NMOS current source 277 to the signal line carrying the current Itu. In other words, the current Itt is divided into the current It1, the current It2, the current It3, and the current Itu in accordance with the ratio of the number of the NMOS switches 271 in the on state, the number of the NMOS switches 272 in the on state, the number of the NMOS switches 551 in the on state, and the number of the NMOS switches 273 in the on state.

Accordingly, the slope D/A converter T505 can suppress an increase in circuit area and power consumption.

Also in this case, the slope D/A converter T205 recursively repeats the division of the current (non-output current) into the output current and the non-output current. In this manner, the slope D/A converter T505 can more easily divide the current generated by receiving the gain control signal into a plurality of output currents and a non-output current.

<Example of Transition of Current Value>

Figure 24:
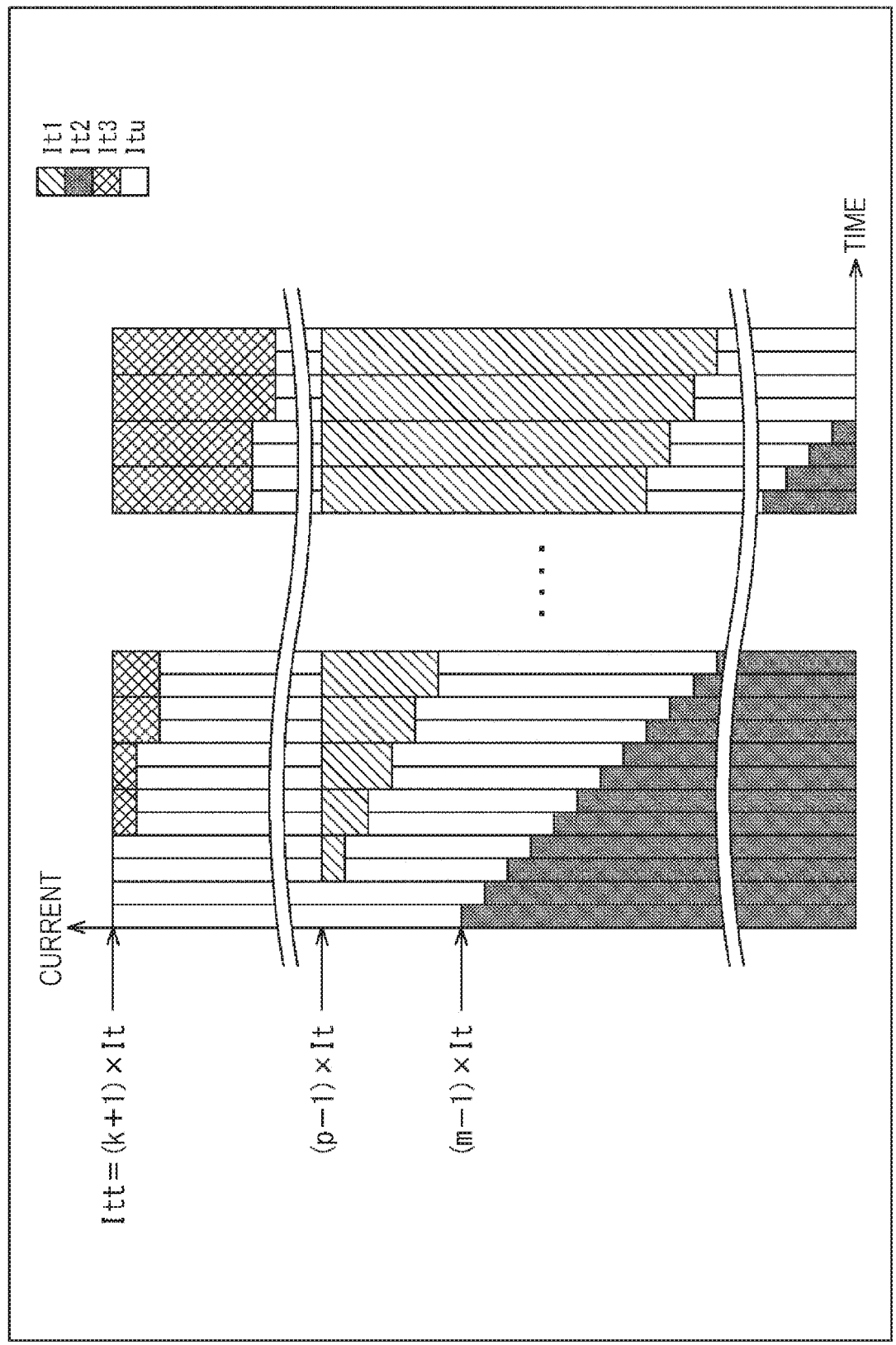
FIG. 24 is a diagram illustrating another example of transition of current division.

FIG. 24 illustrates an example of transition of the current values of the current It1, the current It2, the current It3, and the current Itu in this case. Assuming that the current value per one NMOS current source 277 is It, the total current Itt of (k+1) configurations is calculated as Itt=(k+1)×It. The initial value of the current It1 is set to (p−1)×It, while the initial value of the current It2 is set to (m−1)×It. The current Itt is constant with respect to time, and Itt=It1+It2+It3+Itu is established. During the A/D conversion period, the initial value setting is performed so as not to allow the digital signal TH1 [q] to overtake the digital signal TH3 [q], and the initial value setting is performed so as not to allow the digital signal xTH2 [q] to overtake the digital signal TH1 [q].

In a case where the ratio of the resistance value R1 of the resistor 208, the resistance value R2 of the resistor 209 and the resistance value R3 of the resistor 520 is R1:R2:R3=2:4:1, the ratio of the gradients of the slopes of the reference signals 1 to 3 is 4:−16:1.

As described above, also in the case where the number of channels of output analog signals is three or more, the predetermined current generated by receiving the gain control signal that controls the gain is divided into the plurality of output currents and the non-output current in accordance with the value of the input digital signal. Accordingly, it is possible to suppress an increase in circuit area and power consumption without necessity to provide a slope D/A converter for each of the gains.

4. Others

<Column A/D Conversion>

Note that while the column A/D converter 162 is provided for each of columns of the pixel array 101 in the above description, the number of the column A/D converter 162 is arbitrary, and may be more or less than the number of columns of the pixel array 101. For example, the column A/D converter 162 may be provided for each of a plurality of columns, or the analog signal of one column may be A/D converted by the plural of column A/D converters 162.

<Area A/D Conversion>

Furthermore, while the analog signal read from each of the unit pixels is described as being A/D converted by the column A/D converter 162 (that is, column by column) in the above description, the configuration of the A/D converter is not limited to this example. For example, the pixel array 101 may include a pixel unit formed for each of a predetermined number of unit pixels 121, an A/D converter (also referred to as an area A/D converter) may be provided for each of the pixels units, and an analog signal read from each of the unit pixels may be A/D converted by this area A/D converter (in other words, for each of pixels units).

The pixel unit is a unit pixel group constituted by a plurality of unit pixels (for example, Y rows and X columns (each of X and Y is an arbitrary natural number). The pixel units are formed over the entire pixel array 101, and each of the unit pixels 121 belongs to any of the pixel units. That is, the pixel unit is a unit pixel group included in a partial region obtained by dividing a pixel region formed with the pixel array 101 into a plurality of regions. Note that the size of the pixel unit (the number of unit pixels 121 included in the pixel unit) and shape are arbitrary. The size (number of unit pixels 121) and shape of each of pixels unit may not be the same.

An analog signal (for example, a pixel signal) read from each of the unit pixels is supplied to an area A/D converter via a signal line provided for each of pixels unit. Similarly to the column A/D converter 162 and the column A/D converter 411 described above, the area A/D converter uses a plurality of reference signals generated by the reference signal generation unit 163 to perform A/D conversion on the analog signal read from each of the unit pixels for each of pixels units.

Even in such a case, the reference signal generation unit 163 may have the configuration as described in each of the above-described embodiments. That is, the present technology is applicable even in a case where A/D conversion is performed for each of pixel units, and it is possible to obtain the effects similar to the case of each of the embodiments described above.

<Other Signals>

Moreover, the present technology is applicable in a case where A/D conversion is performed on analog signals read from all the unit pixels of the pixel array 101 by one A/D converter, for example. That is, the present technology is applicable to a reference signal generation unit that generates a reference signal of a plurality of channels, and the reference signals of the plural channels can be used by any type of A/D converter.

Furthermore, the reference signal generated by application of the present technology can be used for A/D conversion of any signal. For example, the reference signal may be used for A/D conversion of a signal other than the analog signal read from a unit pixel. That is, the present technology can be applied not only to image sensors but also to any devices. Moreover, the signal generated by application of the present technology may be a signal other than the reference signal used by the A/D converter. That is, present technology is applicable in a case of generating arbitrary signals of a plurality of channels.

<Multilayer Structure>

Furthermore, a circuit configuration of the image sensor 100 may be formed on a single semiconductor substrate or on a plurality of semiconductor substrates. For example, the image sensor 100 may have a semiconductor substrate of a multilayer structure having a plurality of semiconductor substrates superimposed on each other, and the circuit configuration of the image sensor 100 illustrated in FIG. 1 or the like may be formed on the semiconductor substrates. For example, the pixel array 101 may be formed on a first semiconductor substrate and the column parallel processing unit 102 (including the column A/D converter 162, the reference signal generation unit 163, and the like) may be formed on a second semiconductor substrate. The number of semiconductor substrates, the shape and size of each of the semiconductor substrates, which configuration is formed on which semiconductor substrate, or the like are arbitrary.

<Imaging Apparatus>

Figure 25:
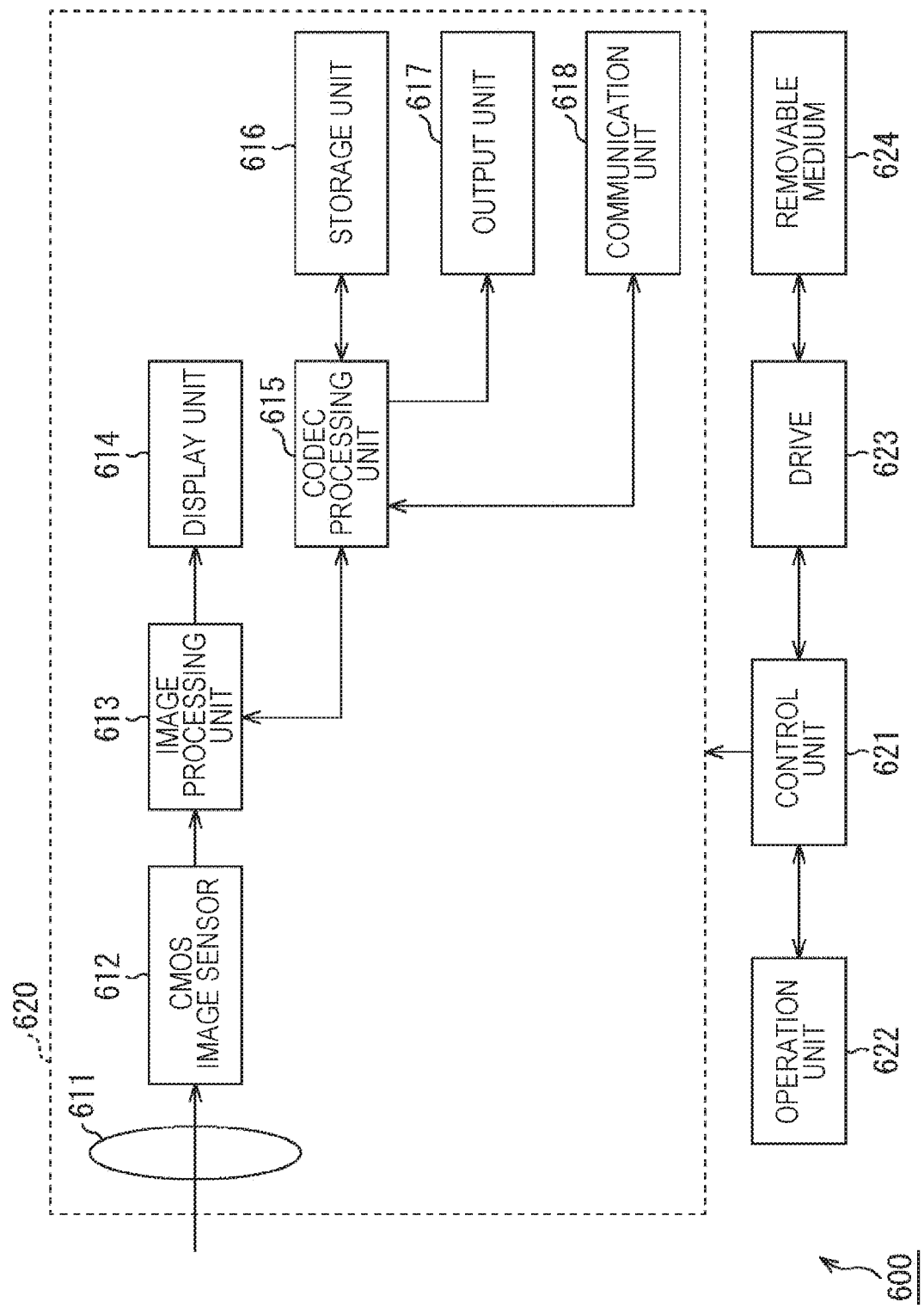
FIG. 25 is a diagram illustrating a main configuration example of an imaging apparatus.

The present technology can be applied to arbitrary systems, apparatuses, processing units, or the like. For example, present technology may be applied to an imaging apparatus using an imaging element. FIG. 25 is a block diagram illustrating a main configuration example of an imaging apparatus as an example of an electronic apparatus according to the present technology. An imaging apparatus 600 illustrated in FIG. 25 is an apparatus that images a subject and outputs a moving image or a still image of the subject as image data.

As illustrated in FIG. 25, the imaging apparatus 600 includes an optical unit 611, a CMOS image sensor 612, an image processing unit 613, a display unit 614, a codec processing unit 615, a storage unit 616, an output unit 617, a communication unit 618, a control unit 621, an operation unit 622, and a drive 623.

The optical unit 611 performs processing related to optics at the time of imaging. For example, the optical unit 611 includes a lens for adjusting a focal point to the subject and collecting light from a focused position, a diaphragm for adjusting the exposure, a shutter for controlling the imaging timing, and the like. The imaging of the subject by the CMOS image sensor 612 is performed via the optical unit 611. That is, light (incident light) from the subject is supplied to the CMOS image sensor 612 via the optical unit 611.

The CMOS image sensor 612 is an imaging element and performs processing related to imaging of a subject. For example, the CMOS image sensor 612 can receive light from a subject, photoelectrically convert it to generate an analog signal (pixel signal) for each of pixels, and A/D convert the analog signal to generate digital data (image data). Furthermore, the CMOS image sensor 612 can perform signal processing such as correlated double sampling (CDS) on the image data, and can supply the processed image data to the image processing unit 613.

The image processing unit 613 performs processing related to image processing on image data. For example, the image processing unit 613 can perform image processing on image data. The image processing may include any processing. For example, the image processing unit 613 can perform color mixture correction, black level correction, white balance adjustment, demosaic processing, matrix processing, gamma correction, YC conversion, or the like. Furthermore, the image processing unit 613 can supply image data to the display unit 614 and the codec processing unit 615, for example. Moreover, the image processing unit 613 can obtain image data from the codec processing unit 615, for example. The image processing unit 613 can perform predetermined image processing on image data obtained by the CMOS image sensor 612 and supplies the image data that has undergone image processing to the display unit 614 and the codec processing unit 615, for example. Furthermore, the image processing unit 613 can perform predetermined image processing on the image data supplied from the codec processing unit 615 and can supply the image data that has undergone image processing to the display unit 614 and the codec processing unit 615, for example.

The display unit 614 includes a liquid crystal display or the like, and performs processing related to display of an image, for example. The display unit 614 can display the image of the image data (for example, the image of a subject) supplied from the image processing unit 613, for example.

The codec processing unit 615 performs processing related to coding and decoding of image data. For example, the codec processing unit 615 can encode image data to generate encoded data. For example, the codec processing unit 615 can obtain image data from the image processing unit 613, the storage unit 616, the communication unit 618, or the like, and encode the obtained image data to generate encoded data. Furthermore, for example, codec processing unit 615 can decode the encoded data and generate the image data of the decoded image. For example, the codec processing unit 615 can obtain encoded data from the storage unit 616, the communication unit 618, or the like, and can decode the obtained data to generate image data of the decoded image. Moreover, for example, the codec processing unit 615 can supply image data and encoded data to the image processing unit 613, the storage unit 616, the output unit 617, the communication unit 618, or the like.

The storage unit 616 includes a hard disk, a semiconductor memory, and the like, and performs processing related to storage of encoded data and image data, for example. For example, the storage unit 616 can store encoded data, image data, or the like supplied from the codec processing unit 615. Furthermore, for example, the storage unit 616 can read stored encoded data and image data at a predetermined timing or in response to a request from the codec processing unit 615 or the like, and can supply the data to the codec processing unit 615.

The output unit 617 includes an external output interface such as an external output terminal, and performs processing related to output of image data and encoded data, for example. For example, the output unit 617 can output image data and encoded data supplied from the codec processing unit 615 to the outside of the imaging apparatus 600 (another apparatus, removable medium, and the like, for example).

The communication unit 618 has a communication interface of a predetermined communication standard and performs processing related to transmission and reception of data with another apparatus. For example, the communication unit 618 can supply various types of information such as image data and encoded data supplied from the codec processing unit 615 to another apparatus as a communication partner of predetermined communication (wired communication or wireless communication) Furthermore, for example, the communication unit 618 can obtain various types of information such as image data and encoded data from another apparatus as a communication partner of predetermined communication (wired communication or wireless communication), and transmits the obtained information to the codec processing unit 615.

The control unit 621 controls operation of each of the processing units (individual processing units illustrated in the dotted line 620, the operation unit 622, and the drive 623) of the imaging apparatus 600.

The operation unit 622 includes optional input devices such as a jog dial (trademark), a key, a button, and a touch panel, for example, receives an operation input by a user, or the like, and transmits a signal corresponding to the operation input to the control unit 621, for example.

The drive 623 reads information stored in a removable medium 624 such as a magnetic disk, an optical disk, a magneto-optical disk, or a semiconductor memory attached to the drive 623 itself, for example. The drive 623 reads various types of information such as programs and data from the removable medium 624, and supplies the information to the control unit 621. Furthermore, in a case where the writable removable medium 624 is attached to the drive 623, the drive 623 can control to store various information such as image data and encoded data supplied via the control unit 621 onto the removable medium 624.

The present technology described in the individual embodiments may be applied as the CMOS image sensor 612 of the imaging apparatus 600 as described above. In other words, the image sensor 100 described above may be applied as the CMOS image sensor 612. Thus, the CMOS image sensor 612 can achieve effects similar to the case of the image sensor 100. Accordingly, similar effects can be achieved on the imaging apparatus 600.

<Application Field of Present Technology>

Systems, apparatuses, processing units, or the like according to the present technology can be used for any fields such as transportation, medical care, crime prevention, agriculture, livestock industry, mining, beauty, factory, household appliance, weather, and monitoring of the nature, for example.

The present technology can also be applied to systems and devices provided for viewing images for enjoyment, for example. Furthermore, the present technology can also be applied to systems and devices provided for traffic, for example. Moreover, the present technology can also be applied to systems and devices used for security, for example. Furthermore, the present technology can also be applied to systems and devices provided for sports, for example. Moreover, the present technology can also be applied to systems and devices used for agriculture, for example. Furthermore, the present technology can also be applied to systems and devices used for livestock industry, for example. Moreover, the present technology can also be applied to systems and devices that monitor natural conditions such as volcanoes, forests, and oceans, for example. Furthermore, the present technology can be applied to systems and devices provided for meteorological observation. Moreover, the present technology can be applied to systems, devices, and the like for observing the ecology of wildlife such as birds, fish, reptiles, amphibians, mammals, insects, and plants, for example.

<Others>

Embodiments of the present technology are not limited to the above-described embodiments, and various modifications are possible within the scope not deviating from the scope and spirit of the present technology.

For example, in the present description, the system represents a set of a plurality of constituents (devices, modules (components), or the like). In other words, all the constituents may be in a same housing but they do not have to be in the same housing. Accordingly, a plurality of apparatuses housed in separate housings and are connected via a network is a system, and one apparatus accommodating a plurality of modules in one housing is also a system.

Furthermore, the configuration described as one apparatus (or one processing unit) may be divided and configured as a plurality of apparatuses (or processing units), for example. Conversely, a configuration described above as a plurality of apparatuses (or processing units) may be collectively configured as a single apparatus (or processing unit). Furthermore, configurations other than the above-described configurations may, of course, be added to the configurations of the apparatuses (or the processing units). Furthermore, as long as configurations or operation are substantially the same in the entire system, the configurations of certain apparatuses (or processing units) may be partially included in the configurations of the other apparatuses (or other processing units)

Note that the present technology described as a plurality of embodiments in this description can be independently and separately implemented as long as there is no inconsistency. Implementation is of course possible with application of any of a plurality of embodiments of the present technology. For example, the present technology described as any of the embodiments can be implemented in combination with the present technology described as the other embodiments. Furthermore, any of the above described present technologies may be implemented in conjunction with other techniques not described above.

Note that the present technology can also be configured as follows.

(1) A signal processing apparatus including a first D/A converter that is a D/A converter convert a digital signal into an analog signal and that is configured to divide a predetermined current generated by receiving a gain control signal that controls a gain into a plurality of output currents and a non-output current in accordance with a value of an input digital signal and configured to output the plurality of output currents as a plurality of analog signals.

(2) The signal processing apparatus according to (1), in which the first D/A converter divides the current into a first output current and a first non-output current in accordance with the value of the digital signal, divides the first non-output current into a second output current and a second non-output current in accordance with the value of the digital signal, and outputs the first output current and the second output current, individually.

(3) The signal processing apparatus according to (1) or (2),
in which the value of the digital signal varies in a time direction so as to increase the first output current and reduce the second output current.

(4) The signal processing apparatus according to any of (1) to (3),
in which the value of the digital signal varies in the time direction so as to increase the first output current and the second output current.

(5) The signal processing apparatus according to any of (1) to (4), further including a current source that receives the gain control signal and generates the current.

(6) The signal processing apparatus according to any of (1) to (5),
in which the first D/A converter includes a switch that drives the digital signal as a control signal and that controls connection between each of signal lines connected to each of a plurality of output terminals that output the analog signals, signal lines connected to a voltage source, with the current source.

(7) The signal processing apparatus according to any of (1) to (6),
in which the first D/A converter includes a plurality of the switches configured in parallel and divides the current into the plurality of output currents and the non-output current in accordance with a ratio of the number of the switches connecting each of the signal lines with the current source.

(8) The signal processing apparatus according to any of (1) to (7), further including a resistor that converts the output current into a voltage for each of the plurality of output currents.

(9) The signal processing apparatus according to any of (1) to (8),
in which resistance values of the resistors corresponding to individual output currents are different from each other.

(10) The signal processing apparatus according to any of (1) to (9), further including a second D/A converter that is a converter to convert a digital signal into an analog signal and that is configured to divide a predetermined current generated by receiving a gain control signal that controls a gain into a single output current and a non-output current in accordance with a value of the input digital signal and configured to use the output current to control the signal level of the analog signal output from the first D/A converter.

(11) The signal processing apparatus according to any of (1) to (10), further including a gain control unit that generates the gain control signal and supplies the generated gain control signal to the first D/A converter so as to control the gain.

(12) The signal processing apparatus according to any of (1) to (11), further including a digital signal generation unit that generates the digital signal and supplies the generated digital signal to the first D/A converter.

(13) The signal processing apparatus according to any of (1) to (12), further including an A/D converter that converts an analog signal into a digital signal using the plurality of analog signals output from the first D/A converter as reference signals.

(14) The signal processing apparatus according to any of (1) to (13), in which the A/D converter is configured to be able to adaptively switch the gain by using the plurality of analog signals as reference signals.

(15) The signal processing apparatus according to any of (1) to (14), in which the plurality of analog signals is used by each of the mutually different A/D converters.

(16) The signal processing apparatus according to any of (1) to (15), in which the A/D converter is provided for each of columns of a pixel array including a plurality of unit pixels arranged in a matrix and converts a pixel signal read from each of pixels of the column corresponding to the own converter from an analog signal into a digital signal.

(17) The signal processing apparatus according to any of (1) to (16), in which the A/D converter is provided for each of areas of a pixel array including a plurality of unit pixels arranged in a matrix and converts a pixel signal read from each of pixels of the area corresponding to the own converter from an analog signal into a digital signal.

(18) A signal processing method including: dividing a predetermined current generated by receiving a gain control signal that controls a gain into a plurality of output currents and a non-output current in accordance with a value of an input digital signal; and outputting the plurality of output currents as a plurality of analog signals.

(19) An imaging element including:

a pixel array including a plurality of unit pixels arranged in a matrix;

a D/A converter that converts a digital signal into an analog signal and that divides a predetermined current generated by receiving a gain control signal that controls a gain into a plurality of output currents and a non-output current in accordance with a value of an input digital signal and then outputs the plurality of output currents as a plurality of analog signals; and an A/D converter that uses the plurality of analog signals output from the D/A converter as reference signals to convert the pixel signal being an analog signal read from the pixel array into a digital signal.

(20) An electronic apparatus including:

an imaging unit that images a subject; and an image processing unit that performs image processing on image data obtained by imaging by the imaging unit, in which the imaging unit includes:

a pixel array including a plurality of unit pixels arranged in a matrix;

a D/A converter that converts a digital signal into an analog signal and that divides a predetermined current generated by receiving a gain control signal that controls a gain into a plurality of output currents and a non-output current in accordance with a value of an input digital signal and then outputs the plurality of output currents as a plurality of analog signals; and an A/D converter that uses the plurality of analog signals output from the D/A converter as reference signals to convert the pixel signal being an analog signal read from the pixel array into a digital signal.

REFERENCE SIGNS LIST

100 Image sensor
101 Pixel array
102 Column parallel processing unit
103 Bus
104 Output terminal
111 System control unit
112 Row scanning unit
113 Column scanning unit
121 Unit pixel
122 Vertical signal line
123 Signal line
124 and 125 Control line
131 to 133 Control line
151 Photodiode
152 Transfer transistor
153 Reset transistor
154 Amplification transistor
155 Selection transistor
156 Floating diffusion
161 Bias circuit
162 Column A/D converter
163 Reference signal generation unit
164 Reference signal line
171 Comparator
172 Counter
173 Determination value latch
174 Selector
175 and 176 Capacitor
201 Constant voltage generation unit
202 Gain control decoder
203 Gain control D/A converter
204 Current mirror
205 Slope D/A converter T
206 and 207 Slope D/A converter B
208 and 209 Resistor
211 Frequency divider
212 NOT gate
213 Shift register
221 Frequency divider
222 NOT gate
223 Shift register
224 and 225 NOT gate
231 Slope D/A converter T
232 Slope D/A converter
233 Gain control unit
234 Digital signal generation unit
251 PMOS current source
252 PMOS switch
253 PMOS switch
254 NOT gate
261 NMOSFET
271 to 273 NMOS switch
274 NOT gate
275 and 276 NOR gate
277 NMOS current source
281 Switch
282 D/A converter
301 and 302 NMOS switch
303 NOT gate
304 NMOS current source
311 and 312 NMOS switch
313 NOT gate
314 NMOS current source
331 Flip-flop
332 Shift register initial value control signal decoder
411 Column A/D converter
421 Comparator
422 Counter
423 and 424 Capacitor
431 Comparator 432 Counter
433 and 434 Capacitor
505 Slope D/A converter T
518 Slope D/A converter B
520 Resistor
531 Frequency divider
532 NOT gate
533 Shift register
541 Slope D/A converter T
542 Slope D/A converter
544 Digital signal generation unit
551 NMOS switch
561 NOT gate
562 NOR gate
563 NOT gate
564 NOR gate
565 NOR gate
581 Switch
582 D/A converter
600 Imaging apparatus
612 CMOS image sensor

The invention claimed is:

1. A signal processing apparatus, comprising:
 a first D/A (Digital to Analog) converter configured to:
  receive a gain control signal that controls a gain of a plurality of analog signals;
  generate a first current based on the received gain control signal;
  divide the generated first current into a plurality of output currents and a first non-output current based on a value of an input digital signal; and
  output the plurality of output currents as the plurality of analog signals; and
 a plurality of resistors configured to output a plurality of voltages corresponding to the plurality of output currents, wherein
  each resistor of the plurality of resistors is configured to convert each output current of the plurality of output currents into a voltage, and
  a resistance value of each resistor of the plurality of resistors is different.

2. The signal processing apparatus according to claim 1, wherein the first D/A converter is further configured to:
 divide the generated first current into a first output current and the first non-output current based on the value of the input digital signal;
 divide the first non-output current into a second output current and a second non-output current based on the value of the input digital signal; and
 output the first output current and the second output current, individually.

3. The signal processing apparatus according to claim 2, wherein the value of the input digital signal varies in a time direction such that the first output current increases in the time direction and the second output current reduces in the time direction.

4. The signal processing apparatus according to claim 2, wherein the value of the input digital signal varies in a time direction such that each of the first output current and the second output current increases in the time direction.

5. The signal processing apparatus according to claim 1, further comprising a current source configured to generate the first current based on the gain control signal.

6. The signal processing apparatus according to claim 5, wherein
 the first D/A converter includes a switch,
 the switch is configured to be driven based on the value of the input digital signal as a control signal, and
 the switch is further configured to control connection between each of a plurality signal lines connected to each of a plurality of output terminals that outputs the plurality of analog signals with the current source, and each of a plurality of signal lines connected to a voltage source with the current source.

7. The signal processing apparatus according to claim 6, wherein
 the first D/A converter includes a plurality of switches configured in parallel, and
 the first D/A converter is further configured to divide the generated first current into the plurality of output currents and the first non-output current based on a ratio of a number of switches of the plurality of switches that connects each of the plurality of signal lines with the current source.

8. The signal processing apparatus according to claim 1, further comprising a second D/A converter configured to:
 generate a second current based on the gain control signal;
 divide the generated second current into a single output current and a second non-output current based on the value of the input digital signal; and
 utilize the single output current to control a signal level of an analog signal of the plurality of analog signals.

9. The signal processing apparatus according to claim 1, further comprising a gain control unit configured to:
 generate the gain control signal; and
 supply the generated gain control signal to the first D/A converter.

10. The signal processing apparatus according to claim 1, further comprising a digital signal generation unit configured to:
 generate the input digital signal; and
 supply the generated input digital signal to the first D/A converter.

11. The signal processing apparatus according to claim 1, further comprising an A/D (Analog to Digital) converter configured to convert an analog signal corresponding to a plurality of unit pixels of a pixel array into a digital signal based on the plurality of analog signals output as reference signals.

12. The signal processing apparatus according to claim 11, wherein the A/D converter is further configured to adaptively switch the gain based on the plurality of analog signals.

13. The signal processing apparatus according to claim 11, further comprising a plurality of A/D converters, wherein
 the plurality of analog signals is used by each of the plurality of A/D converters, and
 the plurality of A/D converters is mutually different.

14. The signal processing apparatus according to claim 11, further comprising a plurality of A/D converters, wherein
 each A/D converter of the plurality of A/D converters is provided for each column of a plurality of columns of the pixel array,
 the pixel array includes the plurality of unit pixels arranged in a matrix, and
 each A/D converter of the plurality of A/D converters is configured to convert a pixel signal read from each of the plurality of unit pixels of the corresponding column into the digital signal.

15. The signal processing apparatus according to claim 11, further comprising a plurality of A/D converters, wherein
each A/D converter of the plurality of A/D converters is provided for each of a plurality of areas of the pixel array,
the pixel array includes the plurality of unit pixels arranged in a matrix, and
each A/D converter of the plurality of A/D converters is configured to convert a pixel signal read from each of the plurality of unit pixels of the corresponding area into the digital signal.

16. A signal processing method, comprising:
in a signal processing apparatus:
receiving a gain control signal that controls a gain of a plurality of analog signals;
generating a current based on the received gain control signal;
dividing the generated current into a plurality of output currents and a non-output current based on a value of an input digital signal;
outputting the plurality of output currents as the plurality of analog signals;
converting, by each resistor of a plurality of resistors, each output current of the plurality of output currents into a voltage, wherein a resistance value of each resistor of the plurality of resistors is different; and
outputting a plurality of voltages corresponding to the plurality of output currents.

17. An imaging element, comprising:
a pixel array including a plurality of unit pixels arranged in a matrix;
a D/A (Digital to Analog) converter configured to:
receive a gain control signal that controls a gain of a plurality of analog signals;
generate a current based on the received gain control signal;
divide the generated current into a plurality of output currents and a non-output current based on a value of an input digital signal; and
output the plurality of output currents as the plurality of analog signals;
a plurality of resistors configured to output a plurality of voltages corresponding to the plurality of output currents, wherein
each resistor of the plurality of resistors is configured to convert each output current of the plurality of output currents into a voltage, and
a resistance value of each resistor of the plurality of resistors is different; and
an A/D (Analog to Digital) converter configured to:
utilize the plurality of analog signals output from the D/A converter as reference signals; and
convert a pixel signal read from the pixel array into a digital signal, wherein the pixel signal corresponds to a specific analog signal.

18. An electronic apparatus, comprising:
an imaging element configured to capture a subject; and
a processor configured to process image data obtained from the imaging element,
wherein the imaging element includes:
a pixel array including a plurality of unit pixels arranged in a matrix;
a D/A (Digital to Analog) converter configured to:
receive a gain control signal that controls a gain of a plurality of analog signals;
generate a current based on the received gain control signal;
divide the generated current into a plurality of output currents and a non-output current based on a value of an input digital signal; and
output the plurality of output currents as the plurality of analog signals;
a plurality of resistors configured to output a plurality of voltages corresponding to the plurality of output currents, wherein
each resistor of the plurality of resistors is configured to convert each output current of the plurality of output currents into a voltage, and
a resistance value of each resistor of the plurality of resistors is different; and
an A/D (Analog to Digital) converter configured to:
utilize the plurality of analog signals output from the D/A converter as reference signals; and
convert a pixel signal read from the pixel array into a digital signal, wherein the pixel signal corresponds to a specific analog signal.

19. A signal processing apparatus, comprising:
a D/A (Digital to Analog) converter configured to:
receive a gain control signal that controls a gain of a plurality of analog signals;
generate a first current based on the received gain control signal;
divide the generated first current into a first output current and a first non-output current based on a value of an input digital signal;
divide the first non-output current into a second output current and a second non-output current based on the value of the input digital signal, wherein the value of the input digital signal varies in a time direction such that the first output current increases in the time direction and the second output current reduces in the time direction; and
output the first output current and the second output current, individually as the analog signals.

20. A signal processing apparatus, comprising:
a D/A (Digital to Analog) converter configured to:
receive a gain control signal that controls a gain of a plurality of analog signals;
generate a first current based on the received gain control signal;
divide the generated first current into a first output current and a first non-output current based on a value of an input digital signal;
divide the first non-output current into a second output current and a second non-output current based on the value of the input digital signal, wherein the value of the input digital signal varies in a time direction such that each of the first output current and the second output current increases in the time direction; and
output the first output current and the second output current, individually as the analog signals.

21. A signal processing apparatus, comprising:
a first D/A (Digital to Analog) converter configured to:
receive a gain control signal that controls a gain of a plurality of analog signals;
generate a first current based on the received gain control signal;
divide the generated first current into a plurality of output currents and a first non-output current based on a value of an input digital signal; and
output the plurality of output currents as the plurality of analog signals; and a second D/A (Digital to Analog) converter configured to:
   generate a second current based on the gain control signal;
   divide the generated second current into a single output current and a second non-output current based on the value of the input digital signal; and
   utilize the single output current to control a signal level of an analog signal of the plurality of analog signals output from the first D/A converter.

* * * * *